(12) United States Patent
Vasen et al.

(10) Patent No.: US 10,923,659 B2
(45) Date of Patent: Feb. 16, 2021

(54) WAFERS FOR USE IN ALIGNING NANOTUBES AND METHODS OF MAKING AND USING THE SAME

(71) Applicant: Taiwan Semiconductor Manufacturing Co., Ltd., Hsinchu (TW)

(72) Inventors: Timothy Vasen, Tervuren (BE); Gerben Doornbos, Kessel-Lo (BE); Marcus Johannes Henricus van Dal, Linden (BE); Matthias Passlack, Huldenberg (BE)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/401,042

(22) Filed: May 1, 2019

(65) Prior Publication Data
US 2020/0106014 A1 Apr. 2, 2020

Related U.S. Application Data

(60) Provisional application No. 62/737,792, filed on Sep. 27, 2018.

(51) Int. Cl.
*H01L 21/00* (2006.01)
*H01L 51/00* (2006.01)
(Continued)

(52) U.S. Cl.
CPC .... *H01L 51/0003* (2013.01); *C23C 16/45525* (2013.01); *C23C 16/56* (2013.01); *H01L 23/544* (2013.01); *H01L 51/003* (2013.01); *H01L 51/0048* (2013.01); *H01L 51/0508* (2013.01); *H01L 2223/54426* (2013.01)

(58) Field of Classification Search
CPC . H01L 51/0003; H01L 51/003; H01L 23/544; H01L 51/0048; H01L 51/0508; H01L 2223/54426; C23C 16/45525; C23C 16/56
See application file for complete search history.

(56) References Cited

U.S. PATENT DOCUMENTS 6,764,874 B1* 7/2004 Zhang .................... B82Y 10/00
257/24
7,294,877 B2* 11/2007 Rueckes ................ B82Y 10/00
257/296
(Continued)

OTHER PUBLICATIONS

Franklin et al., "Sub-10 nm Carbon Nanotube Transistor," *Nano Letters* 12:758-762, 2012.
(Continued)

*Primary Examiner* — Richard A Booth
(74) *Attorney, Agent, or Firm* — Seed IP Law Group LLP

(57) ABSTRACT

Provided herein are wafers that can be used to align carbon nanotubes, as well as methods of making and using the same. Such wafers include alignment areas that have four sides and a surface charge, where the alignment areas are surrounded by areas that have a surface charge of a different polarity. Methods of the disclosure may include depositing and selectively etching a number of hardmasks on a substrate. The described methods may also include depositing a carbon nanotube on such a wafer.

20 Claims, 35 Drawing Sheets

(51) Int. Cl.
  *C23C 16/455* (2006.01)
  *C23C 16/56* (2006.01)
  *H01L 23/544* (2006.01)
  *H01L 51/05* (2006.01)

(56) References Cited

U.S. PATENT DOCUMENTS

| | | | |
|---|---|---|---|
| 7,390,527 B2 * | 6/2008 | Hyldgaard | B82Y 10/00 427/523 |
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |

OTHER PUBLICATIONS

Han et al., "High-speed logic integrated circuits with solution-processed self-assembled carbon nanotubes," *Nature Nanotechnology* 12:861-866, 2017.

Klinke et al., "Field-Effect Transistors Assembled from Functionalized Carbon Nanotubes," *Nano Letters* 6(5):906-910, 2006.

Lu et al., "DNA Functionalization of Carbon Nanotubes for Ultrathin Atomic Layer Deposition of High κ Dielectrics for Nanotube Transistors with 60 mV/Decade Switching," *J. Am. Chem. Soc.* 128:3518-3519, 2006.

Park et al., "High-density integration of carbon nanotubes via chemical self-assembly," *Nature Nanotechnology* 7:787-791, 2012.

Raymor Industries Inc., "IsoSol-S100® Polymer-Wrapper Nanotubes," Technical Data Sheet, 2014. (7 pages).

Shulaker et al., "High-Performance Carbon Nanotube Field-Effect Transistors," IEEE International Electron Devices Meeting, San Francisco, California, USA, Dec. 15-17, 2014. (4 pages).

* cited by examiner

WAFERS FOR USE IN ALIGNING NANOTUBES AND METHODS OF MAKING AND USING THE SAME

BACKGROUND

Recently, carbon nanotubes have been used in scaled field effect transistors (FETs). Carbon nanotubes have a cylindrical geometry, a diameter of about 1 nanometer, and may provide excellent electrical and mechanical properties. Various methods of placing carbon nanotubes on a substrate have been used. Some methods result in random placement, orientation, or bundling.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
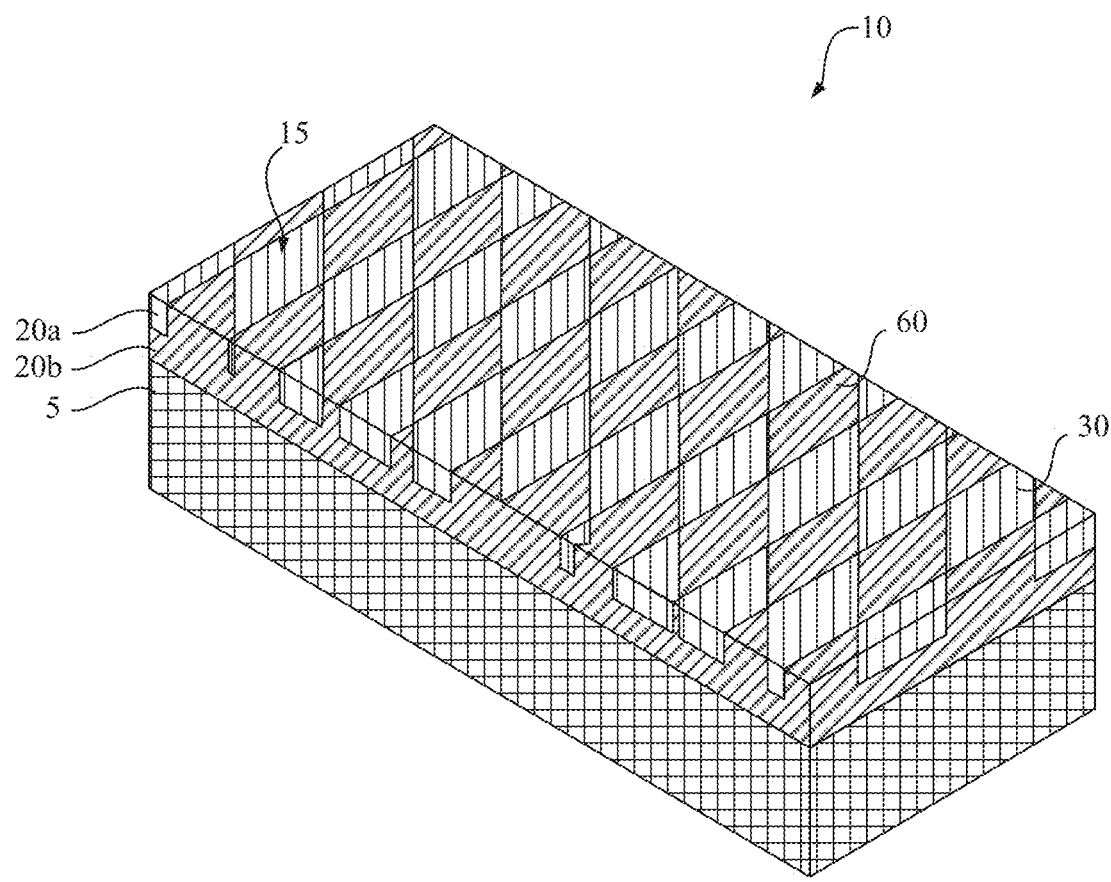
FIGS. 1A and 1B illustrate a wafer of the disclosure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein include wafers for use in aligning a carbon nanotube (CNT), as well as methods of making and using the same. Such wafers generally include first areas arranged with second areas, the first and second areas having surface charges of different polarities. The arrangement of the first and second areas on a wafer can be chosen in order to produce a desired arrangement of CNTs.

As described in more detail below, embodiments of the methods of the disclosure include forming a wafer as described herein. In some embodiments, methods of the disclosure include applying a series of hardmasks onto a substrate and selectively removing portions of the hardmasks to produce the desired arrangement of the first and second areas.

Further embodiments of the described methods include depositing and aligning one or more CNTs on a surface of a wafer of the disclosure. The described wafers and methods of using the same can produce a highly ordered arrangement of CNTs. Such an arrangement reduces bundling and allows for lithographically defining the distance between individual CNTs (i.e., CNT to CNT pitch). By producing such an ordered arrangement of CNTs, the variability in the number of CNTs in a single transistor is reduced.

The CNTs, once aligned, can be transferred to a second wafer and used to form a transistor or other device, as described herein. Additionally, once the CNTs are removed, the wafer of the present disclosure may be used to align additional CNTs.

Figure 1B:
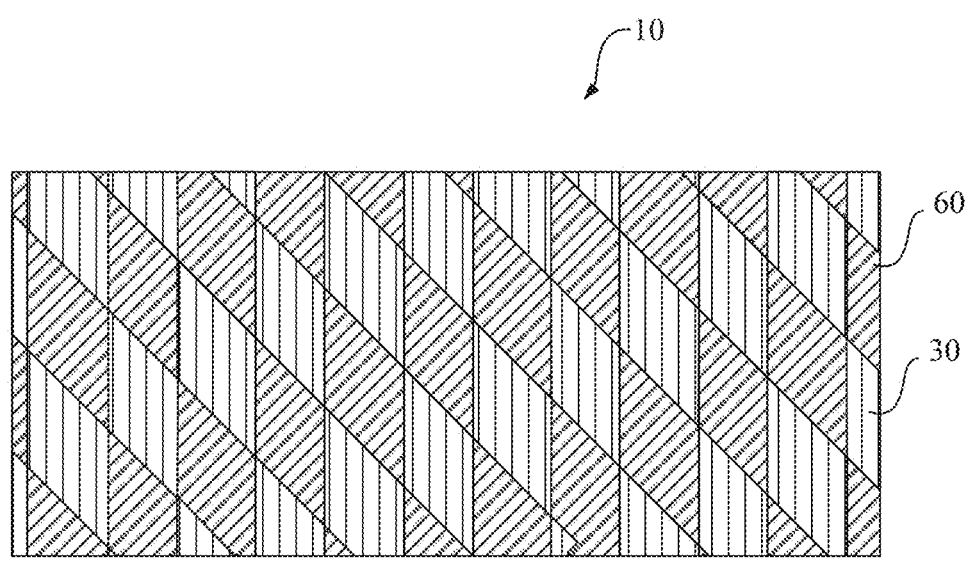

FIG. 1A illustrates a perspective view of a wafer of the disclosure, according to some embodiments. FIG. 1B shows a top down view of the wafer of FIG. 1A. As shown in FIG. 1A, a wafer 10 includes a substrate 5. Any suitable substrate may be used. In embodiments, substrate 5 is a semiconductor material, e.g., silicon (Si), germanium (Ge), a SiGe alloy, and the like. In some embodiments, the substrate 5 may comprise a compound semiconductor. Examples of compound semiconductors include Group IV-IV compound semiconductors, such as silicon carbide (SiC) and SiGe; Group III-V compound semiconductors such as gallium arsenide (GaAs), gallium phosphide (GaP), gallium nitride (GaN), indium phosphide (InP), indium arsenide (InAs), indium antimonide (InSb), gallium arsenide phosphide (GaAsP), aluminium gallium nitride (AlGaN), aluminium indium arsenide (AlInAs), aluminium gallium arsenide (AlGaAs), gallium indium arsenide (GaInAs), gallium indium phosphide (GaInP), gallium indium arsenide phosphide (GaInAsP); or combinations thereof. In some embodiments, the substrate 5 is a silicon-on insulator (SOI) substrate. Amorphous substrates, such as amorphous Si or amorphous SiC, or insulating material, such as a silicon oxide may also be used as the substrate 5.

In various embodiments, a wafer 10 includes one or more layers 20 formed on the top surface of the substrate 5. In some embodiments, the one or more layers 20 are made of an insulating material. In various embodiments, the top layer includes more than one material. In the embodiment illustrated in FIG. 1A, the wafer 10 includes two layers 20a and 20b, although more or fewer layers may be present.

A wafer 10 has a top surface 15 that includes at least one alignment area 30. In embodiments, the at least one alignment area 30 is in a layer 20 on the substrate 5. In some embodiments, the at least one alignment area 30 is in the substrate 5.

Each alignment area 30 has a surface charge that has a polarity. In some embodiments, an alignment area 30 has a positive charge. In other embodiments, an alignment area 30 has a negative charge. In embodiments, the surface charge of each alignment area 30 has the same polarity. In some embodiments, the surface charge of each alignment area 30 is substantially the same. "Substantially," as used herein means that a first value is within ±30% of a second value. In some embodiments, substantially means that a first value is within ±25% of a second value. In other embodiments, substantially means that a first value is within ±20% of a second value. In other embodiments, substantially means that a first value is within ±15% of a second value. In other embodiments, substantially means that a first value is within ±10% of a second value. In other embodiments, substantially means that a first value is within ±5% of a second value. In other certain embodiments, the surface charge of a first alignment area is the same as a surface charge of a second alignment area. In particular embodiments, the surface charge of each alignment area is the same.

A surface charge may be produced by any suitable methods. In various embodiments, an alignment area is formed of a different material than a spacing area. In some embodiments, an alignment area is a metal oxide. For example, an alignment area may be $HfO_2$ and a spacing area may be $SiO_2$.

In some such embodiments, a surface charge is produced by depositing a charged molecule onto an alignment area. In some embodiments, the charged molecule is covalently bound to the alignment area. In other embodiments, the charged molecule is electrostatically bound to the alignment area. In further embodiments, the charged molecule is bound to the alignment area by hydrogen bonding.

In embodiments, the alignment area is a metal oxide (e.g., $Al_2O_3$) and the charged molecule comprises hydroxamic acid. In a specific embodiment, the alignment area is $HfO_2$, and the charged molecule is selected from:

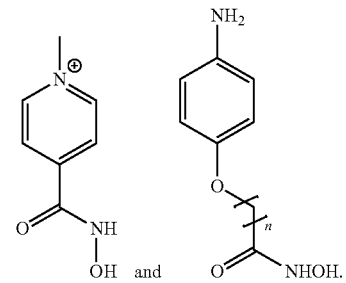

In such embodiments, a charged molecule is applied in solution to a substrate having alignment areas of $HfO_2$ and spacing areas of $SiO_2$. In embodiments where the charged molecule contains a hydroxamic acid end group, which are known to self-assemble on metal oxide surfaces but not on $SiO_2$ surfaces, the charged molecules will bind with the $HfO_2$ and are thus deposited onto the surface of the alignment area.

In other embodiments, a surface charge is produced by treating an alignment area (e.g., of Si, SiN, etc.) with hydrogen fluoride (HF). In such embodiments, the HF removes the native oxide of the alignment area (e.g., SiN), which differentiates the surface of the alignment area from the spacing areas (e.g., $SiO_2$).

In other embodiments, a surface charge is produced using electron beam lithographic methods.

Figure 2A:
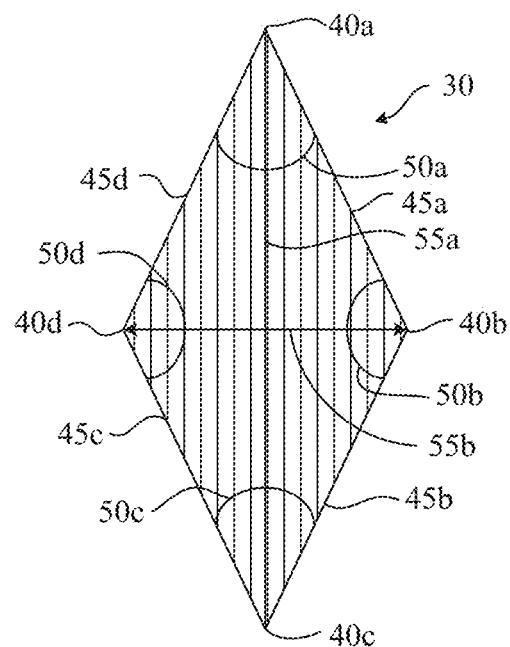
FIGS. 2A-2C illustrate an exemplary alignment area, spacing area, and arrangement of alignment areas and spacing areas, in accordance with some embodiments.

An illustrative schematic of an alignment area 30 in accordance with some embodiments is shown in FIG. 2A. In various embodiments, an alignment area 30 is a regular polygon. In embodiments, an alignment area 30 has four vertices 40a-40d and four edges 45a-45d. In other words, in some embodiments, an alignment area 30 is a quadrilateral. In various embodiments, each edge of the four edges 45a-45d is the substantially the same length. In some embodiments, an alignment area 30 has a diamond shape.

Each vertex 40a-40d has an interior angle 50a-50d, respectively. In embodiments, interior angles 50a and 50c each independently range from about 0° to about 90°. "About," as used herein, denotes that the actual value may be somewhat more or somewhat less than the stated value or range, to within ±20% of the stated value. In other embodiments, about means that the actual value is within ±15% of the stated value. In other embodiments, about means that the actual value is within ±10% of the stated value. In other embodiments, about means that the actual value is within ±5% of the stated value. In other embodiments, about means that the actual value is within ±1% of the stated value.

In embodiments, interior angles 50a and 50c each independently range from about 30° to about 60°. In embodiments, interior angles 50*a* and 50*c* each independently range from about 40° to about 50°. In embodiments, interior angles 50*a* and 50*c* are each independently about 45°. In embodiments, interior angles 50*a* and 50*c* are substantially the same.

In embodiments, interior angles 50*b* and 50*d* each independently range from about 90° to about 180°. In embodiments, interior angles 50*b* and 50*d* each independently range from about 105° to about 165°. In embodiments, interior angles 50*b* and 50*d* each independently range from about 120° to about 150°. In embodiments, interior angles 50*b* and 50*d* are each independently about 135°. In embodiments, interior angles 50*b* and 50*d* are substantially the same.

In embodiments, an alignment area 30 has a first diagonal 55*a* between a first vertex 40*a* and a second vertex 40*c*. In some embodiments, the first diagonal 55*a* ranges from about 6 nanometers (nm) to about 42 nm. In some embodiments, the first diagonal 55*a* ranges from about 10 nm to about 32 nm. In some embodiments, the first diagonal 55*a* is no more than 21 nm. In some embodiments, the first diagonal 55*a* is less than 21 nm. In some embodiments, the first diagonal 55*a* ranges from about 10 nm to about 21 nm.

In embodiments, an alignment area 30 has a second diagonal 55*b* between a third vertex 40*b* and a fourth vertex 40*d*. In various embodiments, the second diagonal 55*b* is transverse to the first diagonal 55*a*. In some embodiments, the second diagonal 55*b* is substantially perpendicular to the first diagonal 55*a*. In some embodiments, the second diagonal 55*b* is shorter than the first diagonal 55*a*. In some embodiments, the second diagonal 55*b* ranges from about 3 nanometers (nm) to about 20 nm. In some embodiments, the second diagonal 55*b* ranges from about 5 nm to about 15 nm. In some embodiments, the second diagonal 55*b* is no more than 10 nm. In some embodiments, the second diagonal 55*b* is less than 10 nm. In some embodiments, the second diagonal 55*b* ranges from about 5 nm to about 10 nm.

Figure 2B:
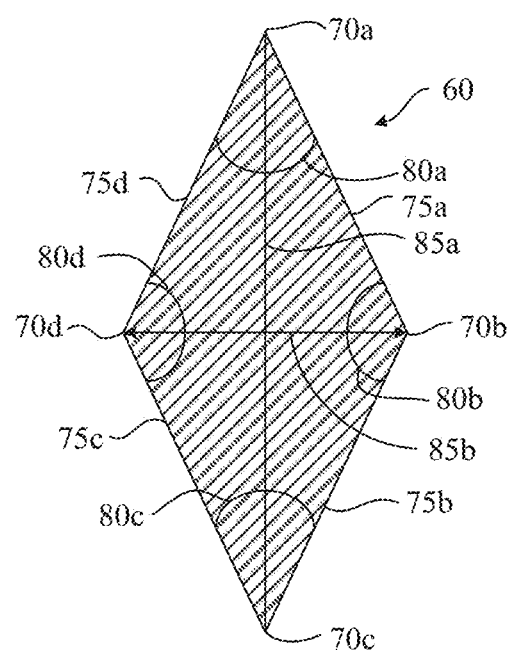

An illustrative schematic of a spacing area 60 in accordance with some embodiments is shown in FIG. 2B. In various embodiments, a spacing area is a regular polygon. In some embodiments, a spacing area 60 has at least three edges. As shown in FIG. 2B, a spacing area 60 may have four edges. In some embodiments, a spacing area 60 has more than four edges. In various embodiments, each of the edges is substantially the same length. In embodiments, a spacing area 60 has a diamond shape.

In embodiments, a spacing area 60 has four vertices 70*a*-70*d*. Each vertex 70*a*-70*d* has an interior angle 80*a*-80*d*, respectively. In some embodiments, interior angles 80*a* and 80*c* each independently range from about 0° to about 90°. In embodiments, interior angles 80*a* and 80*c* each independently range from about 30° to about 60°. In embodiments, interior angles 80*a* and 80*c* each independently range from about 40° to about 50°. In embodiments, interior angles 80*a* and 80*c* are each independently about 45°. In some embodiments, interior angles 80*a* and 80*c* are substantially the same.

In embodiments, interior angles 80*b* and 80*d* each independently range from about 90° to about 180°. In embodiments, interior angles 80*b* and 80*d* each independently range from about 105° to about 165°. In embodiments, interior angles 80*b* and 80*d* each independently range from about 120° to about 150°. In embodiments, interior angles 80*b* and 80*d* are each independently about 135°. In some embodiments, interior angles 80*b* and 80*d* are substantially the same.

In embodiments, a spacing area 60 has a first diagonal 85*a* between a first vertex 70*a* and a second vertex 70*c*. In some embodiments, the first diagonal 85*a* ranges from about 6 nanometers (nm) to about 42 nm. In some embodiments, the first diagonal 85*a* ranges from about 10 nm to about 32 nm. In some embodiments, the first diagonal 85*a* is no more than 21 nm. In some embodiments, the first diagonal 85*a* is less than 21 nm. In some embodiments, the first diagonal 85*a* ranges from about 10 nm to about 21 nm.

In some embodiments, an alignment area 60 has a second diagonal 85*b* between a third vertex 70*b* and a fourth vertex 70*d*. In various embodiments, the second diagonal 85*b* is transverse to the first diagonal 85*a*. In some embodiments, the second diagonal 85*b* is substantially perpendicular to the first diagonal 85*a*. In some embodiments, the second diagonal 85*b* is shorter than the first diagonal 85*a*. In some embodiments, the second diagonal 85*b* ranges from about 3 nanometers (nm) to about 20 nm. In some embodiments, the second diagonal 85*b* ranges from about 5 nm to about 15 nm. In some embodiments, the second diagonal 85*b* is no more than 10 nm. In some embodiments, the second diagonal 85*b* is less than 10 nm. In some embodiments, the second diagonal 85*b* ranges from about 5 nm to about 10 nm.

Figure 2C:
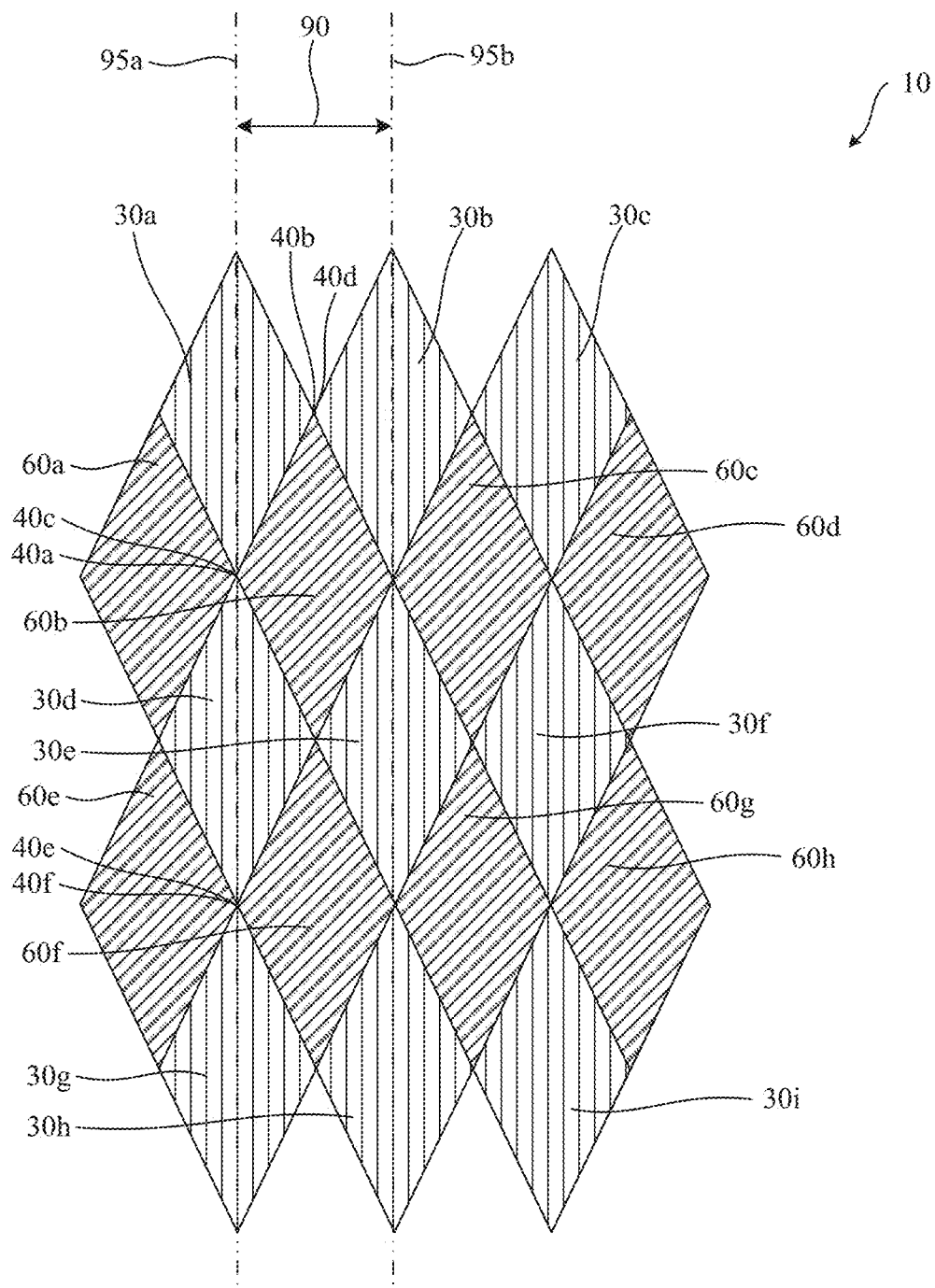

FIG. 2C illustrates an exemplary arrangement of alignment areas 30*a*-30*i* and spacing areas 60*a*-60*h* on a top surface of a wafer 10, in accordance with some embodiments. In various embodiments, a plurality of alignment areas 30*a*-30*i* is arranged with a plurality of spacing areas 60*a*-60*h* in an alternating pattern.

In various embodiments, each alignment area 30*a*-30*i* has four edges, as described above. In such embodiments, each edge of the four edges may abut a spacing area 60. In other words, the edges of one alignment area 30 do not contact the edges of another alignment area 30. Thus, in particular embodiments, an alignment area 30 is surrounded by one or more spacing areas 60.

Each spacing area 60*a*-60*h* has a surface charge that is different than the surface charge of each alignment area 30*a*-30*i*. Any suitable technique, such as those described above with regard to alignment areas, may be used to provide the differences in surface charge between spacing areas 60*a*-60*h* and alignment areas 30*a*-30*i*.

In various embodiments, a surface charge of one or more spacing areas 60*a*-60*h* has a different polarity than a surface charge of any one or more alignment areas 30*a*-30*i*, which can be achieved using the techniques described above. In some embodiments, one or more spacing areas 60*a*-60*h* have a positive charge and one or more alignment areas 30*a*-30*i* have a negative charge. In other embodiments, one or more spacing areas 60*a*-60*h* have a negative charge and one or more alignment areas 30*a*-30*i* have a positive charge. In embodiments, the surface charge of each spacing area has the same polarity. In some embodiments, the surface charge of each spacing area is substantially the same. In certain embodiments, the surface charge of a first spacing area is the same as a surface charge of a second spacing area. In particular embodiments, the surface charge of each spacing area is substantially the same.

Accordingly, embodiments of the present application include wafers, comprising: (i) a plurality of alignment areas having a first surface charge of a first polarity, each alignment area of the plurality of alignment areas having a first diagonal between a first vertex and a second vertex, the first diagonal extending in a first direction; and (ii) a plurality of spacing areas having a second surface charge of a second polarity that is different than the first polarity, the four edges of each alignment area of the plurality of alignment areas abutting at least one spacing area of the plurality of spacing areas.

In various embodiments, adjacent alignment areas are arranged such that a vertex of a first alignment area 30a contacts a vertex of a second alignment area 30d. In various embodiments, a first vertex 40c of a first alignment area 30a contacts a first vertex 40a of a second alignment area 30d. In embodiments, a first vertex 40b of a first alignment area 30a contacts a first vertex 40d of a third alignment area 30b. In some embodiments, the four vertices of an alignment area 30e contact four other alignment areas 30b, 30f, 30h, 30d.

In some embodiments, at least three alignment areas 30a, 30d, 30g are aligned along a common diagonal 95a. In such embodiments, a first vertex 40c of a first alignment area 30a contacts a first vertex 40a of a second alignment area 30d, and a second vertex 40e of the second alignment area 30d contacts a first vertex 40f of a third alignment area 30g. In various embodiments, four or more alignment areas (e.g., five or more alignment areas, six or more alignment areas, seven or more alignment areas, 10 or more alignment areas, 20 or more alignment areas, etc.) are aligned along the common diagonal 95a.

In embodiments, a first subset of the alignment areas 30a, 30d, 30g are aligned along a first common diagonal 95a and a second subset of the alignment areas 30b, 30e, 30h are aligned along a second common diagonal 95b. In embodiments, the first diagonal 95a is substantially parallel to the second diagonal 95b.

In embodiments, two lines (e.g. the first common diagonal 95a and the second common diagonal 95b) are considered substantially parallel if any two measurements between the first line (e.g. the first common diagonal 95a) and the second line (e.g. the second common diagonal 95b) are within ±20% of each other. In some embodiments, two lines (e.g. the first common diagonal 95a and the second common diagonal 95b) are considered substantially parallel if any two measurements between the first line and the second line are within ±15% of each other. In some embodiments, two lines (e.g. the first common diagonal 95a and the second common diagonal 95b) are considered substantially parallel if any two measurements between the first line and the second line are within ±10% of each other. In further embodiments, two lines (e.g. the first common diagonal 95a and the second common diagonal 95b) are considered substantially parallel if any two measurements between the first line and the second line are within ±5% of each other. In still further embodiments, two lines (e.g. the first common diagonal 95a and the second common diagonal 95b) are considered substantially parallel if any two measurements between the first line and the second line are within ±1% of each other.

In some embodiments, the distance 90 between the first common diagonal 95a and the second common diagonal 95b ranges from about 3 nanometers (nm) to about 20 nm. In some embodiments, the distance 90 between the first common diagonal 95a and the second common diagonal 95b ranges from about 5 nm to about 15 nm. In some embodiments, the distance 90 between the first common diagonal 95a and the second common diagonal 95b is no more than 10 nm. In some embodiments, the distance 90 between the first common diagonal 95a and the second common diagonal 95b is less than 10 nm. In some embodiments, the distance 90 between the first common diagonal 95a and the second common diagonal 95b ranges from about 5 nm to about 10 nm.

Embodiments of the present disclosure further include methods of forming a wafer as described herein. Accordingly, embodiments of the present disclosure include a method including forming a wafer comprising: (i) a plurality of alignment areas having a first surface charge of a first polarity, each alignment area of the plurality of alignment areas having a first diagonal between a first vertex and a second vertex, the first diagonal extending in a first direction; and (ii) a plurality of spacing areas having a second surface charge of a second polarity that is different than the first polarity, the four edges of each alignment area of the plurality of alignment areas abutting at least one spacing area of the plurality of spacing areas.

FIG. 3-FIG. 15 illustrate steps of a method of the disclosure, in accordance with some embodiments. For each figure, view A shows a perspective view, view B shows a top down view, and view C shows a cross section along line A-A of view B. In embodiments, the method illustrated is used to produce the wafer shown in FIG. 1A and FIG. 1B.

Figure 3A:
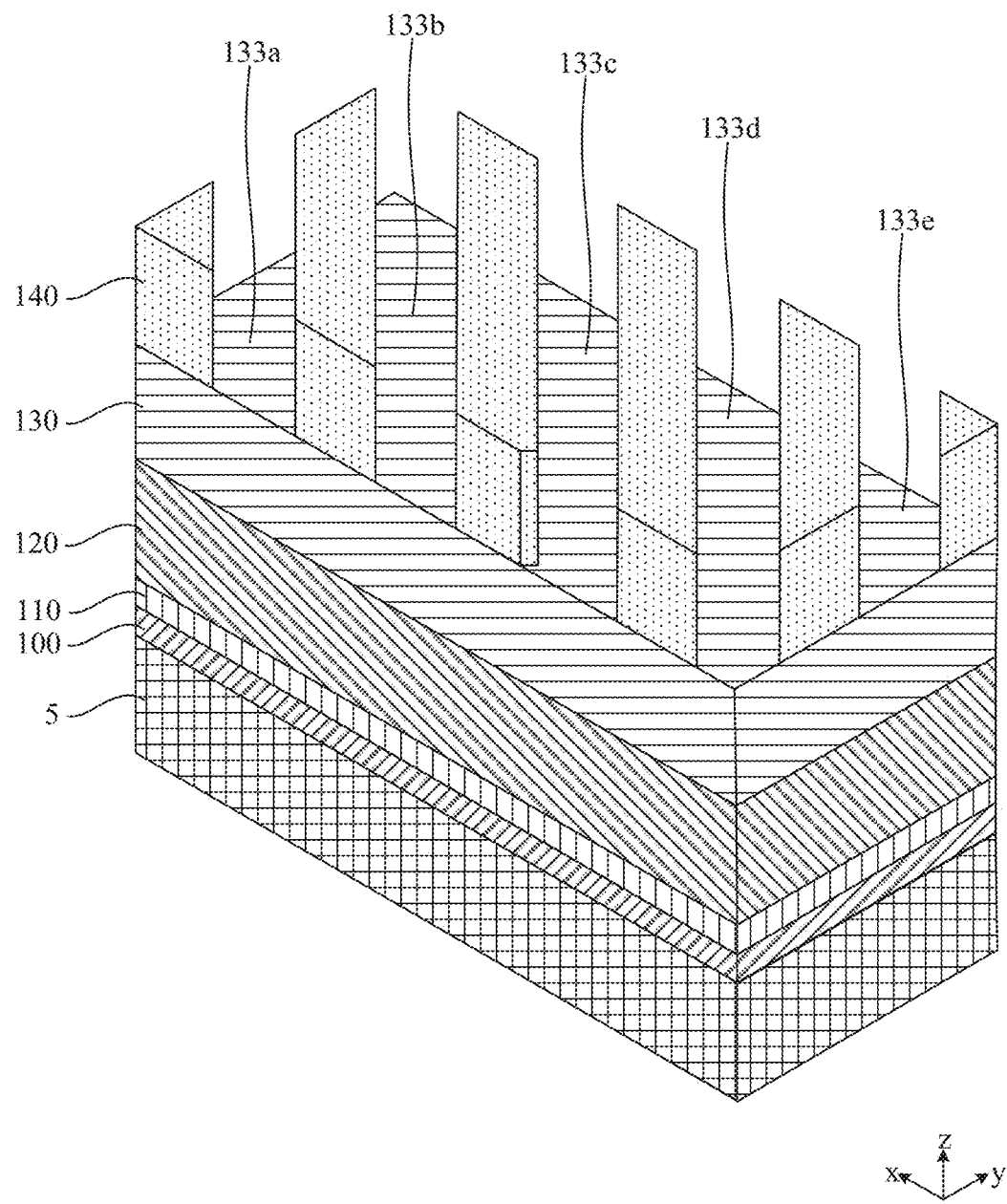
FIGS. 3A-3C illustrate a step of a method of forming a wafer of the disclosure, in accordance with some embodiments.

FIG. 3A shows a layered intermediate wafer. As shown, the layered intermediate wafer includes a substrate 5 and a first insulating layer 100 of a first material on substrate 5. The first insulating material may be any suitable insulator, such as a metal oxide. In embodiments, the first insulating material is $HfO_2$. In some embodiments, methods of the present disclosure include depositing the first insulating layer 100 on the substrate 5.

In some embodiments, a second insulating layer 110 of a second insulating material is on the first insulating layer 100. The second insulating material may be any suitable insulator. In embodiments, the second insulating material is $SiO_2$. In some embodiments, methods of the present disclosure include depositing the second insulating layer 110 on the first insulating layer 100.

In some embodiments, methods of the present disclosure include depositing a plurality of hardmasks on an intermediate wafer comprising a substrate 5, a first insulating layer 100 on the substrate 5, and a second insulating layer 110 on the first insulating layer 100.

In various embodiments, the plurality of hardmasks includes a first hardmask 120. In some embodiments, a first hardmask 120 is on the second insulating layer 110. The first hardmask 120 may be any suitable material. Such a material will provide etch selectivity between the first hardmask and one or more of the other hardmask layers and insulating layers described herein using an acceptable etchant. In various embodiments, the first hardmask 120 may be silicon dioxide, silicon nitride, amorphous silicon, amorphous carbon, and the like. In some embodiments, methods of the present disclosure include depositing the first hardmask 120 on the second insulating layer 110.

As shown in FIG. 3A, a second hardmask 130 is on the first hardmask 120. The second hardmask 130 may be any suitable material. Such a material will provide etch selectivity between the second hardmask and one or more of the other hardmask layers and insulating layers described herein, using an acceptable etchant. In various embodiments, the second hardmask 130 may be silicon dioxide, silicon nitride, amorphous silicon, amorphous carbon, and the like. In some embodiments, methods of the present disclosure include depositing the second hardmask 130 on the first hardmask 120.

In some embodiments, a third hardmask 140 is on the second hardmask 130. The third hardmask 140 may be any suitable material. Such a material will provide etch selectivity between the third hardmask 140 and one or more of the other hardmask layers and insulating layers described herein using an acceptable etchant. In various embodiments, the third hardmask 140 may be silicon dioxide, silicon nitride, amorphous silicon, amorphous carbon, and the like. In some embodiments, methods of the disclosure include depositing the third hardmask 140 on the second hardmask 130.

Figure 3B:
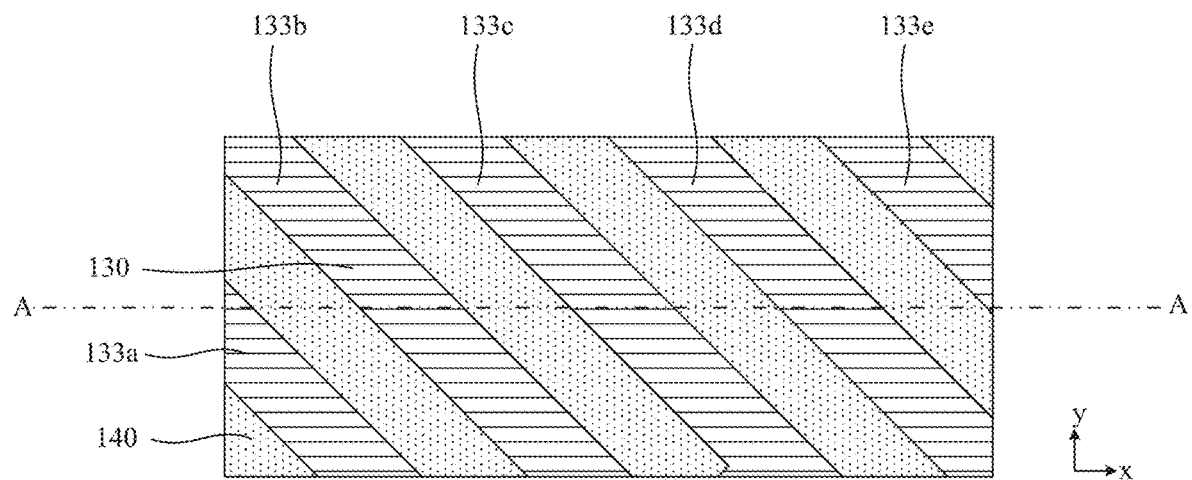
Figure 3C:
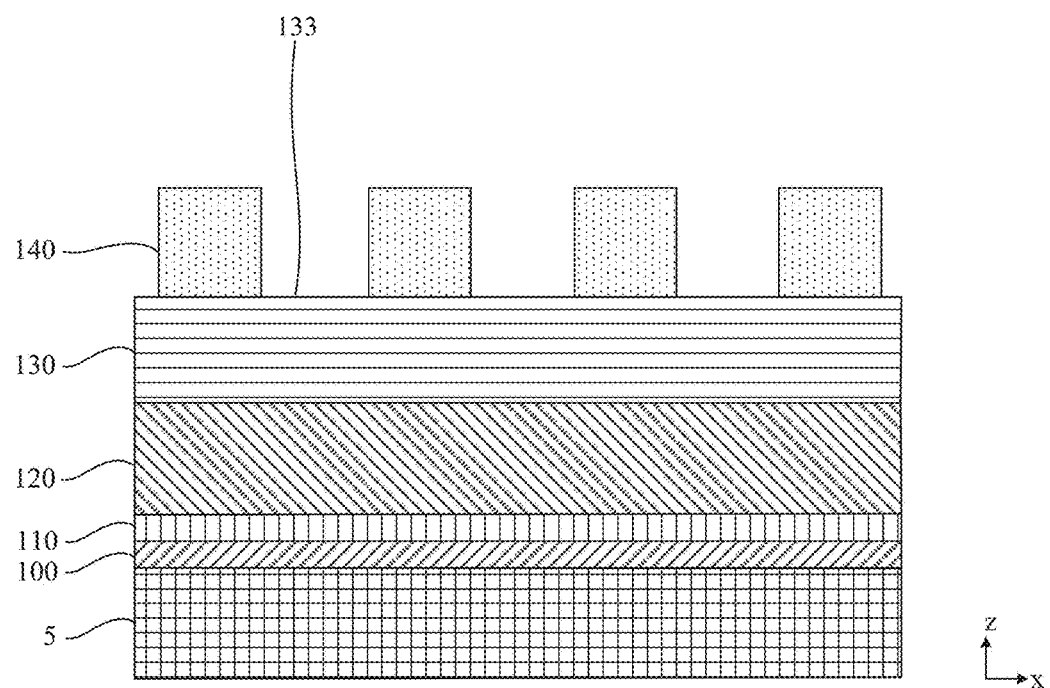

In various embodiments, the third hardmask 140 is patterned in a plurality of sections having edges that are substantially parallel, as shown in FIGS. 3A-3C. Alternating sections are selectively removed to expose portions 133a-133e of the second hardmask 130. In various embodiments, the alternating sections are selectively removed by etching.

Figure 4A:
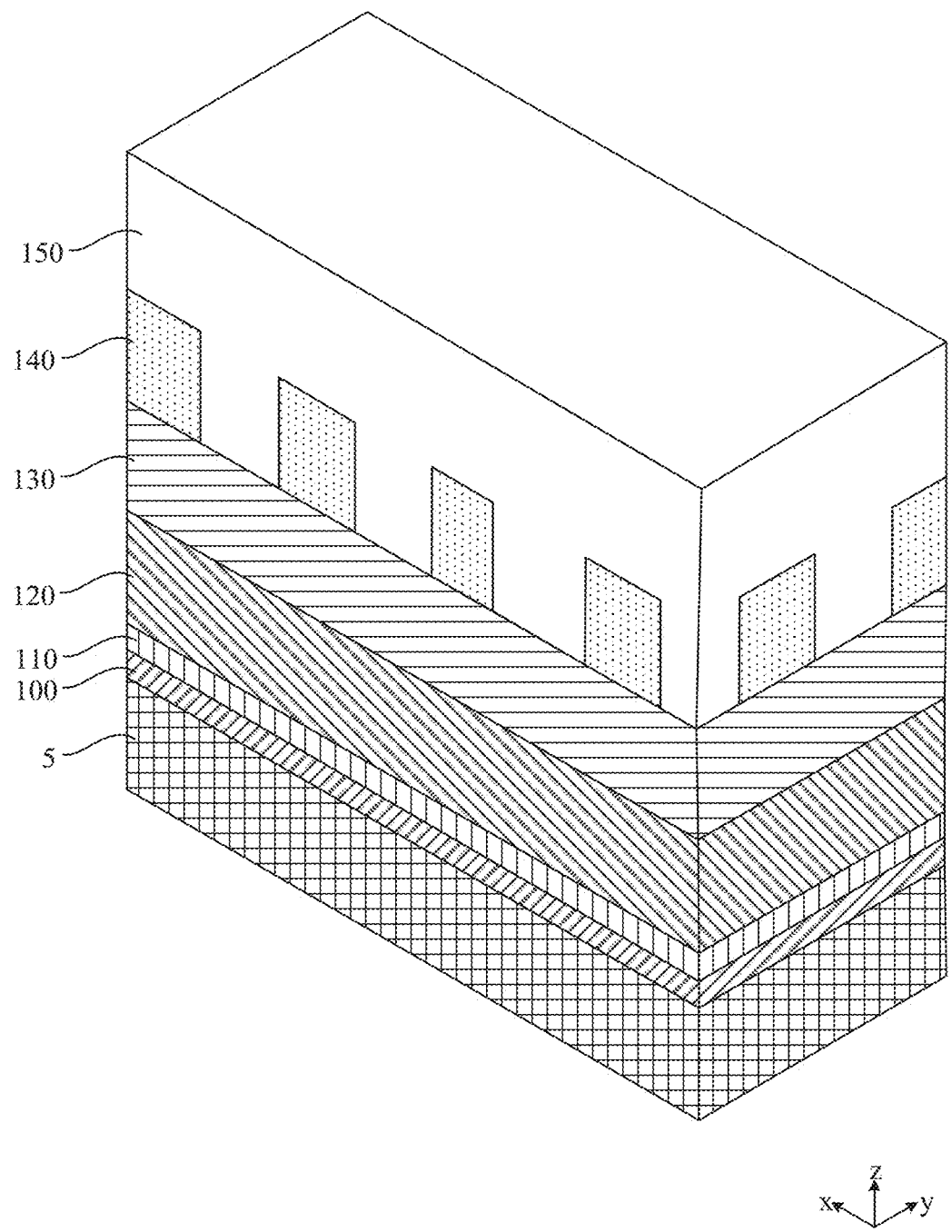
FIGS. 4A-4C illustrate a step of a method of forming a wafer of the disclosure, in accordance with some embodiments.
Figure 4B:
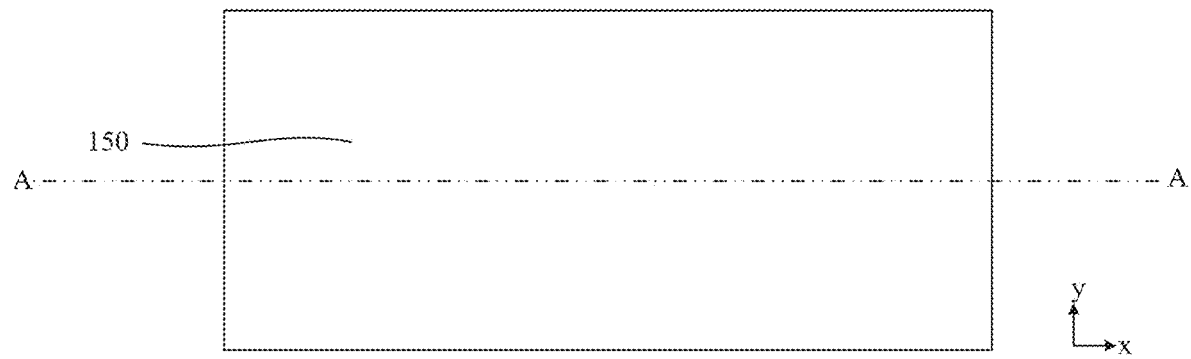
Figure 4C:
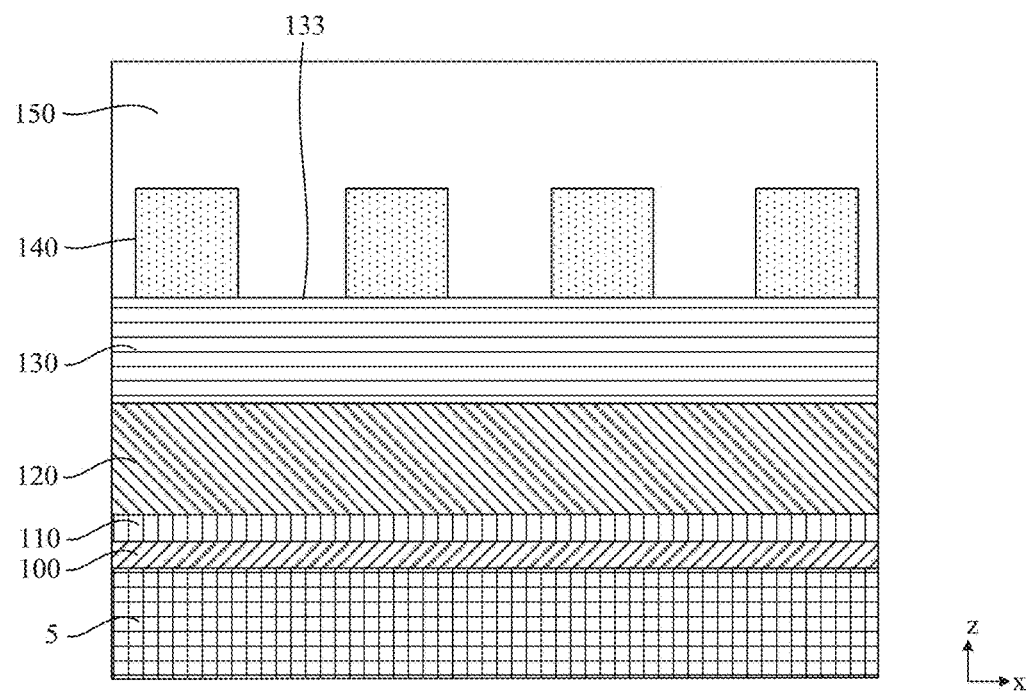

As shown in FIG. 4A-4C, a fourth hardmask 150 is deposited onto an intermediate wafer. In embodiments, the fourth hardmask 150 is deposited onto the remaining portions of the third hardmask 140 and the exposed portions of the second hardmask 133 (e.g., 133a-133e). The fourth hardmask 150 may be any suitable material. Such a material will provide etch selectivity between the fourth hardmask and one or more of the other hardmask layers and insulating layers described herein using an acceptable etchant. In various embodiments, the fourth hardmask 150 may be silicon dioxide, silicon nitride, amorphous silicon, amorphous carbon, and the like.

Figure 5A:
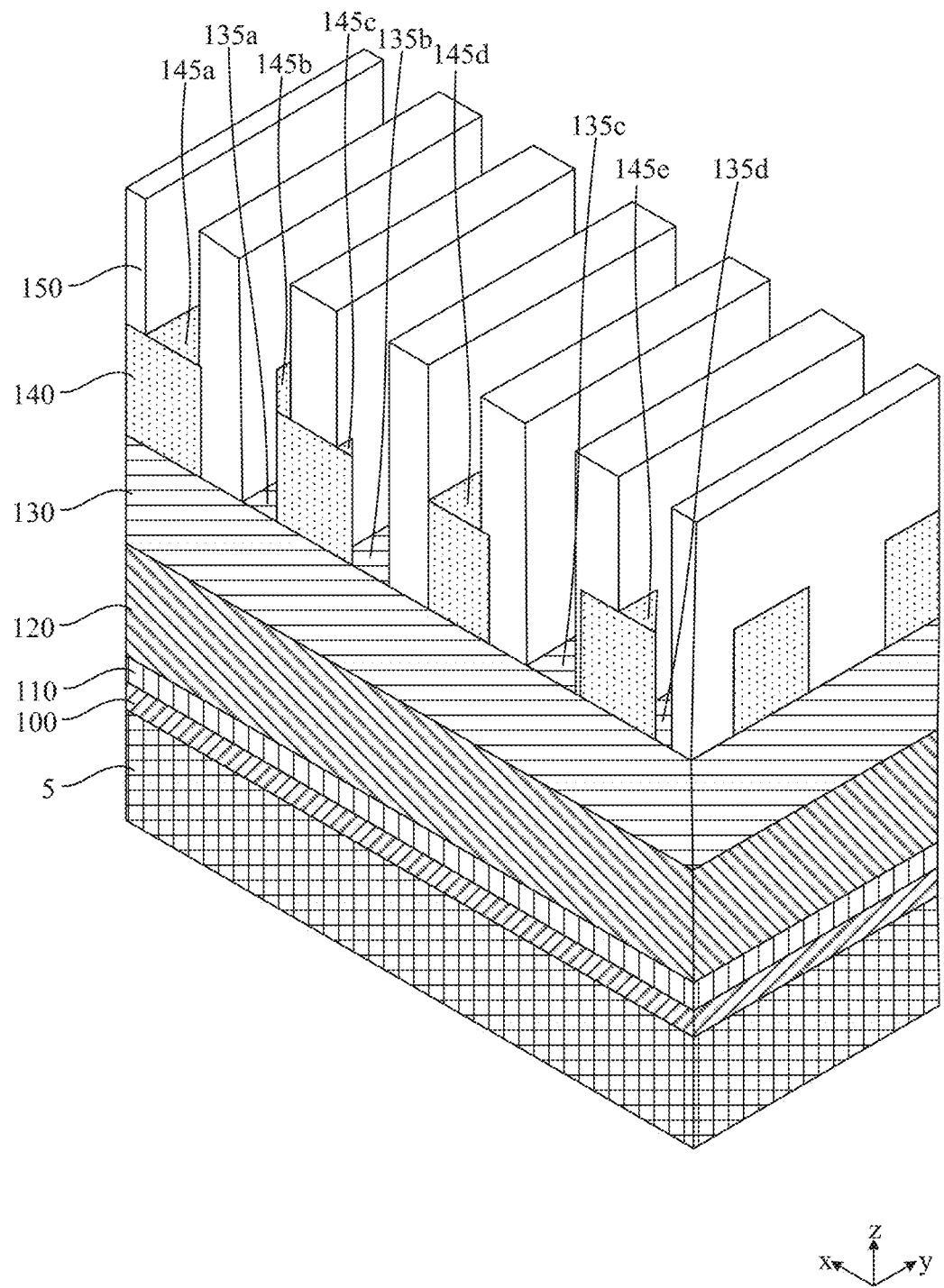
FIGS. 5A-5C illustrate a step of a method of forming a wafer of the disclosure, in accordance with some embodiments.
Figure 5B:
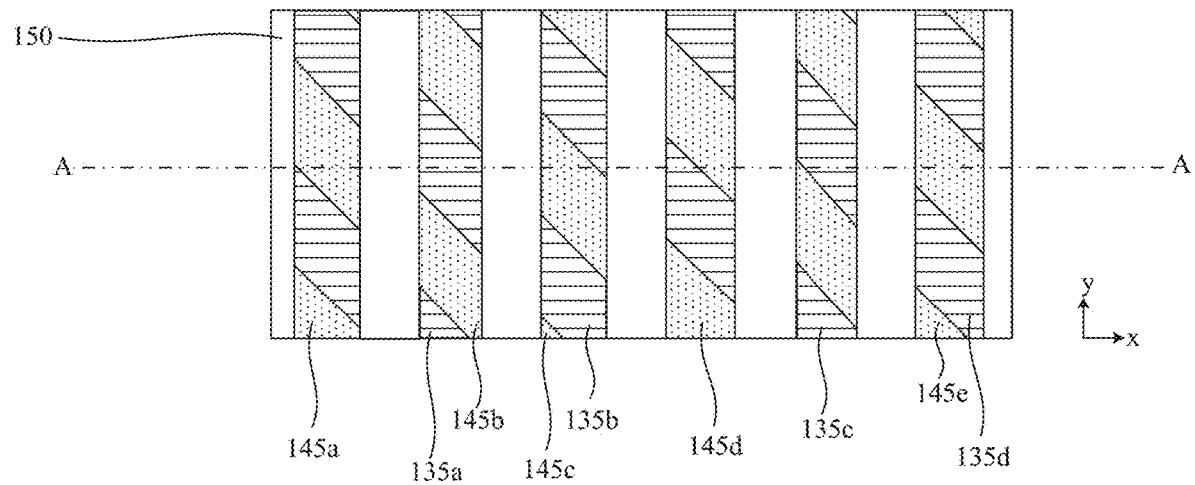
Figure 5C:
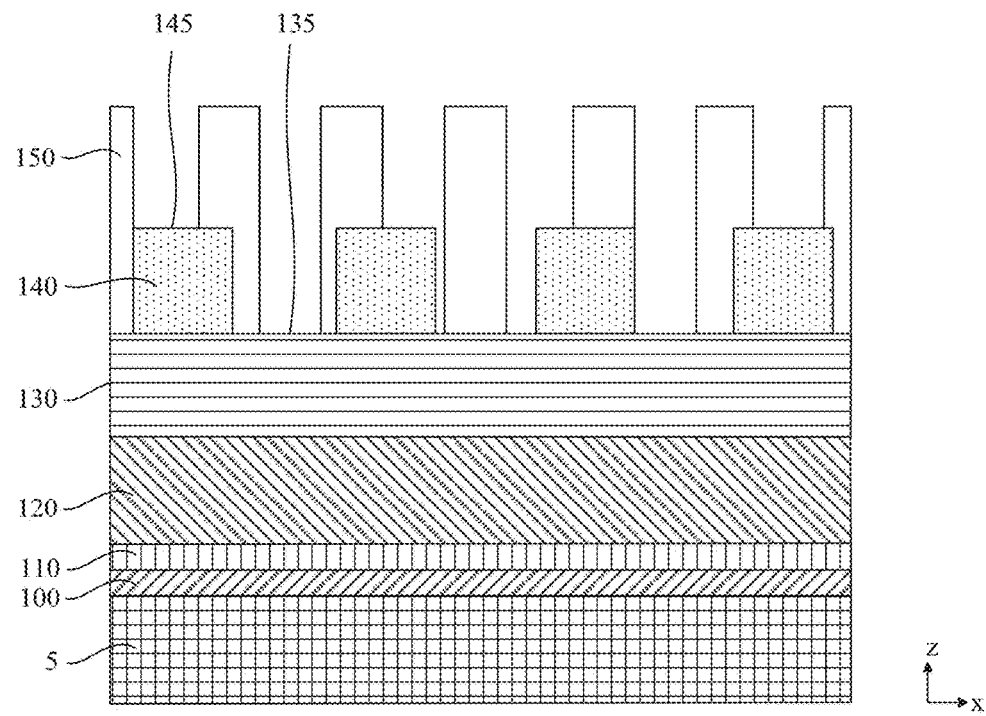

As shown in FIGS. 5A-5C, the fourth hardmask 150 is patterned in a plurality of sections having edges that are substantially parallel. In various embodiments, the fourth hardmask 150 is patterned into sections in a direction that is transverse to the patterning of the third hardmask 140. Alternating sections are selectively removed to expose portions 135 (e.g., 135a-135d) of the second hardmask 130 and portions 145 (e.g., 145a-145e) of the third hardmask 140. In various embodiments, the alternating sections are selectively removed by etching.

Figure 6A:
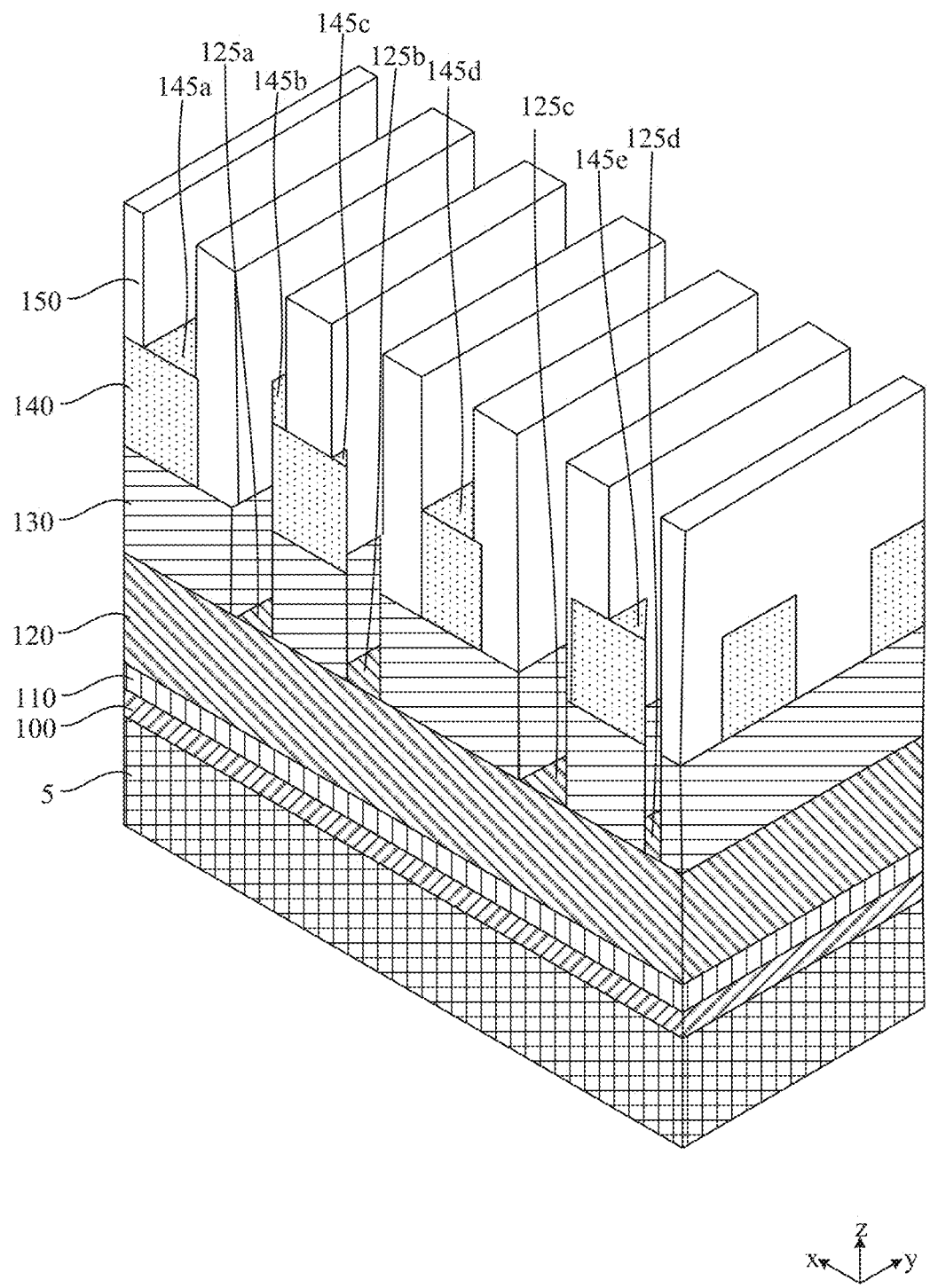
FIGS. 6A-6C illustrate a step of a method of forming a wafer of the disclosure, in accordance with some embodiments.
Figure 6B:
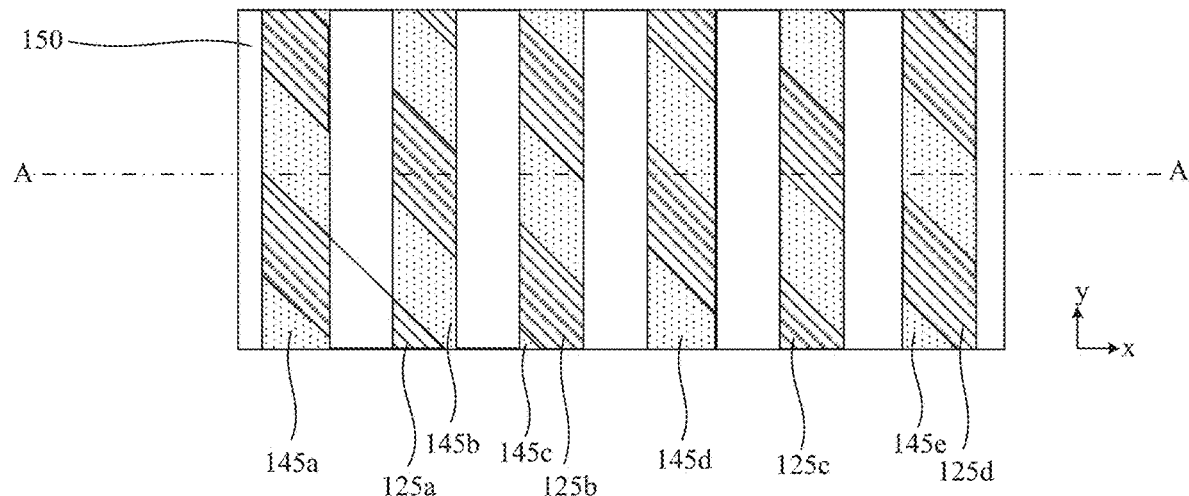
Figure 6C:
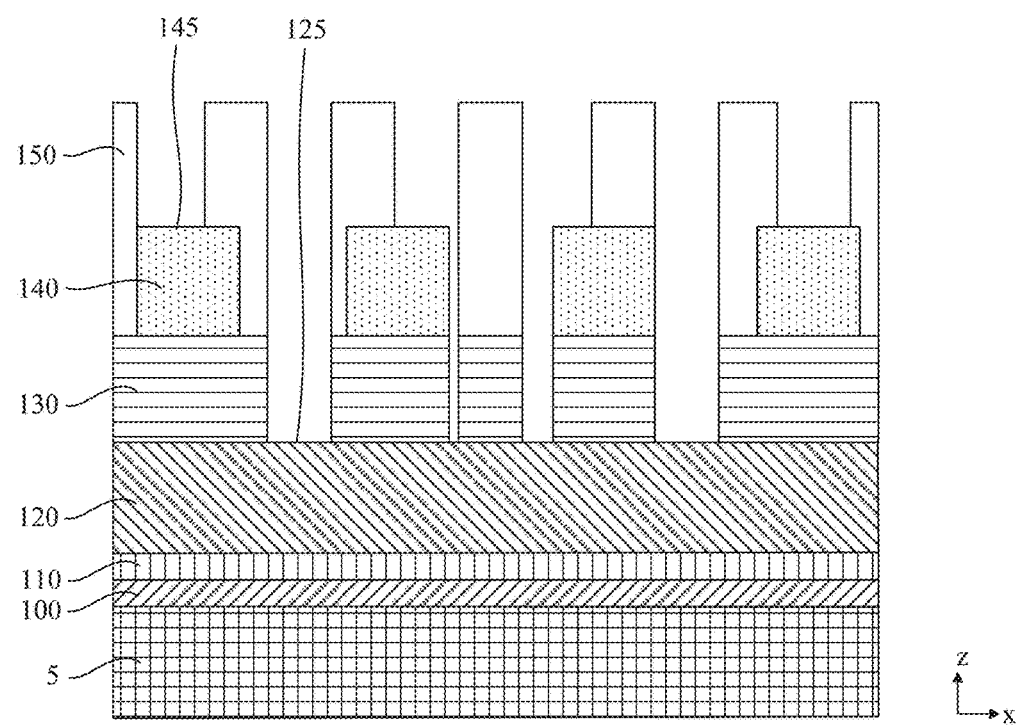

The exposed portions 135 of the second hardmask 130 are then removed (e.g., etched), as shown in FIGS. 6A-6C. The removal of the exposed portions 135 of the second hardmask 130 exposes portions 125 (e.g., 125a-125d) of the first hardmask 120. In various embodiments, exposed portions 135 of the second hardmask 130 are removed by etching.

Figure 7A:
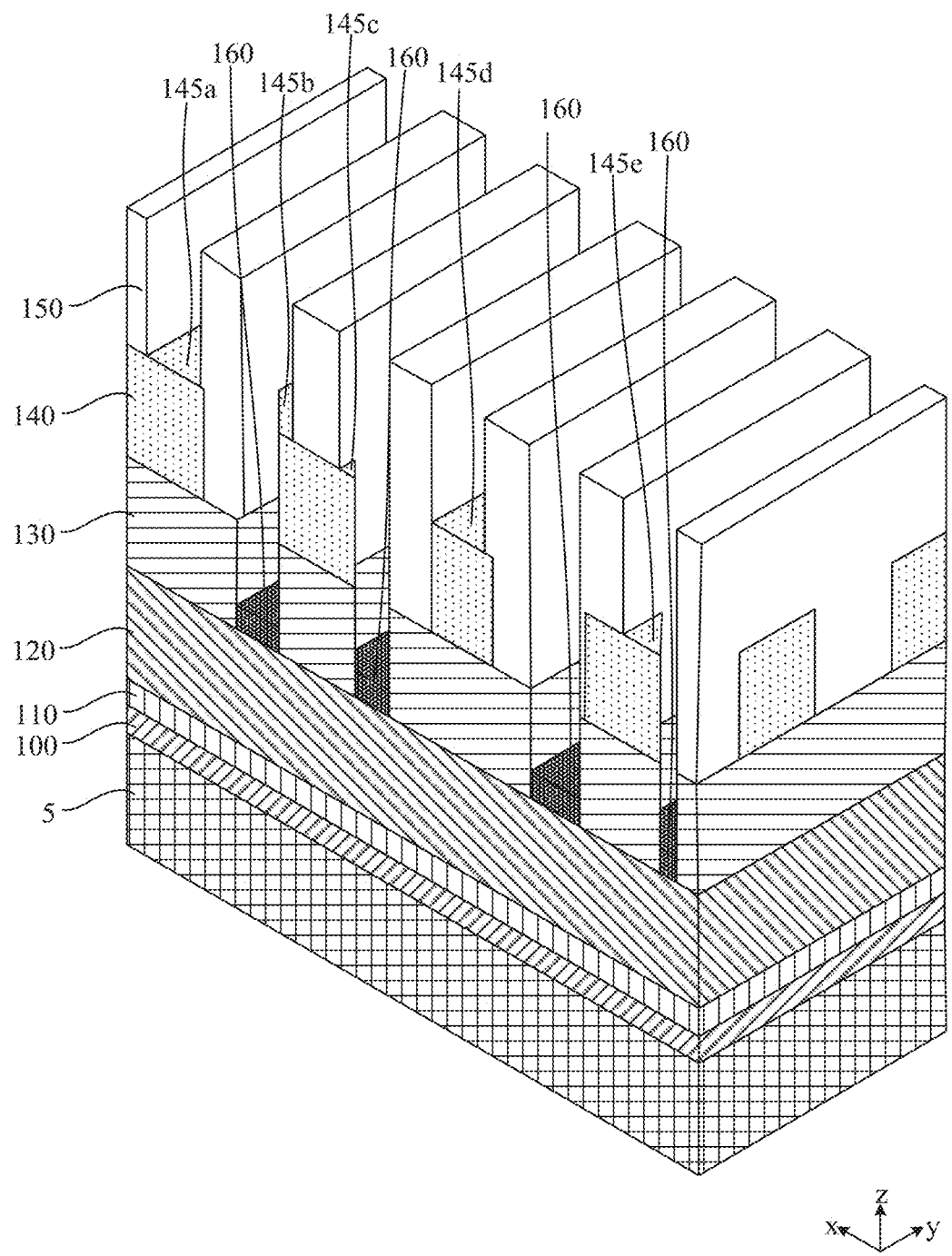
FIGS. 7A-7C illustrate a step of a method of forming a wafer of the disclosure, in accordance with some embodiments.
Figure 7B:
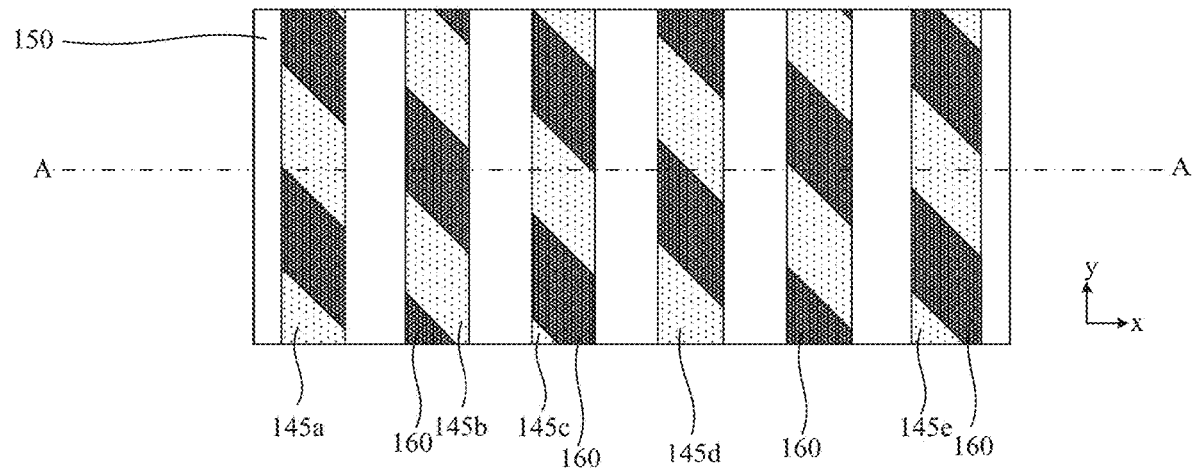
Figure 7C:
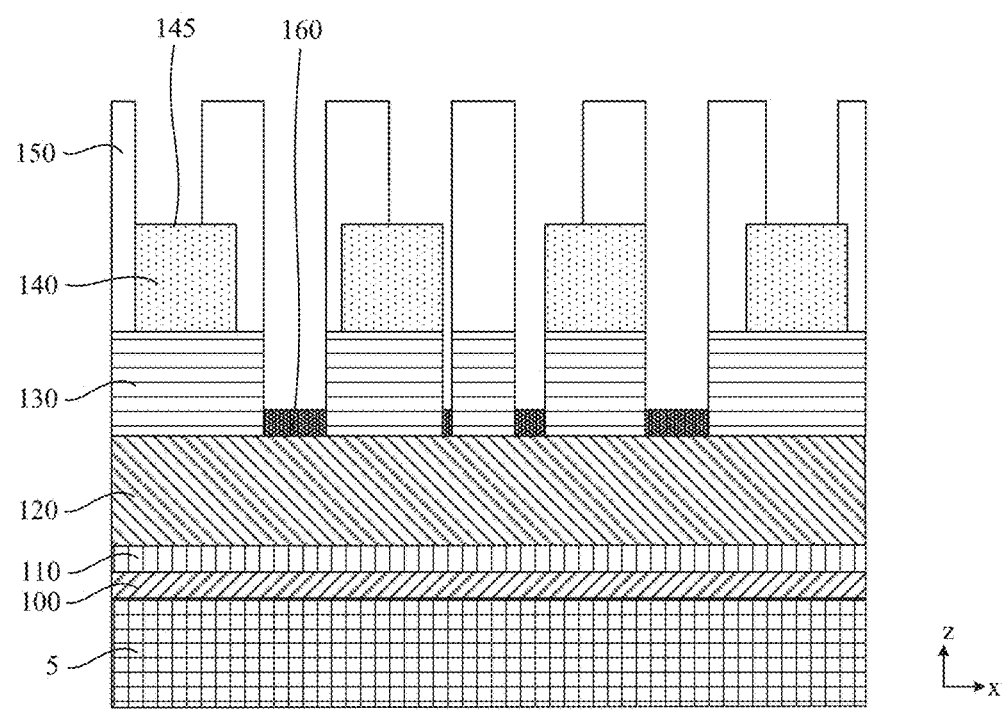

As shown in FIGS. 7A-7C, a fifth hardmask 160 is deposited on the exposed portions 125 of the first hardmask. In embodiments, the deposition of the fifth hardmask 160 is a selective deposition (e.g., area-selective atomic layer deposition, area-selective epitaxy, etc.). The fifth hardmask 160 may be any suitable material. In embodiments, the fifth hardmask 160 is TiN. In some such embodiments, the fifth hardmask 160 is TiN and the first hardmask is SiO$_2$.

Figure 8A:
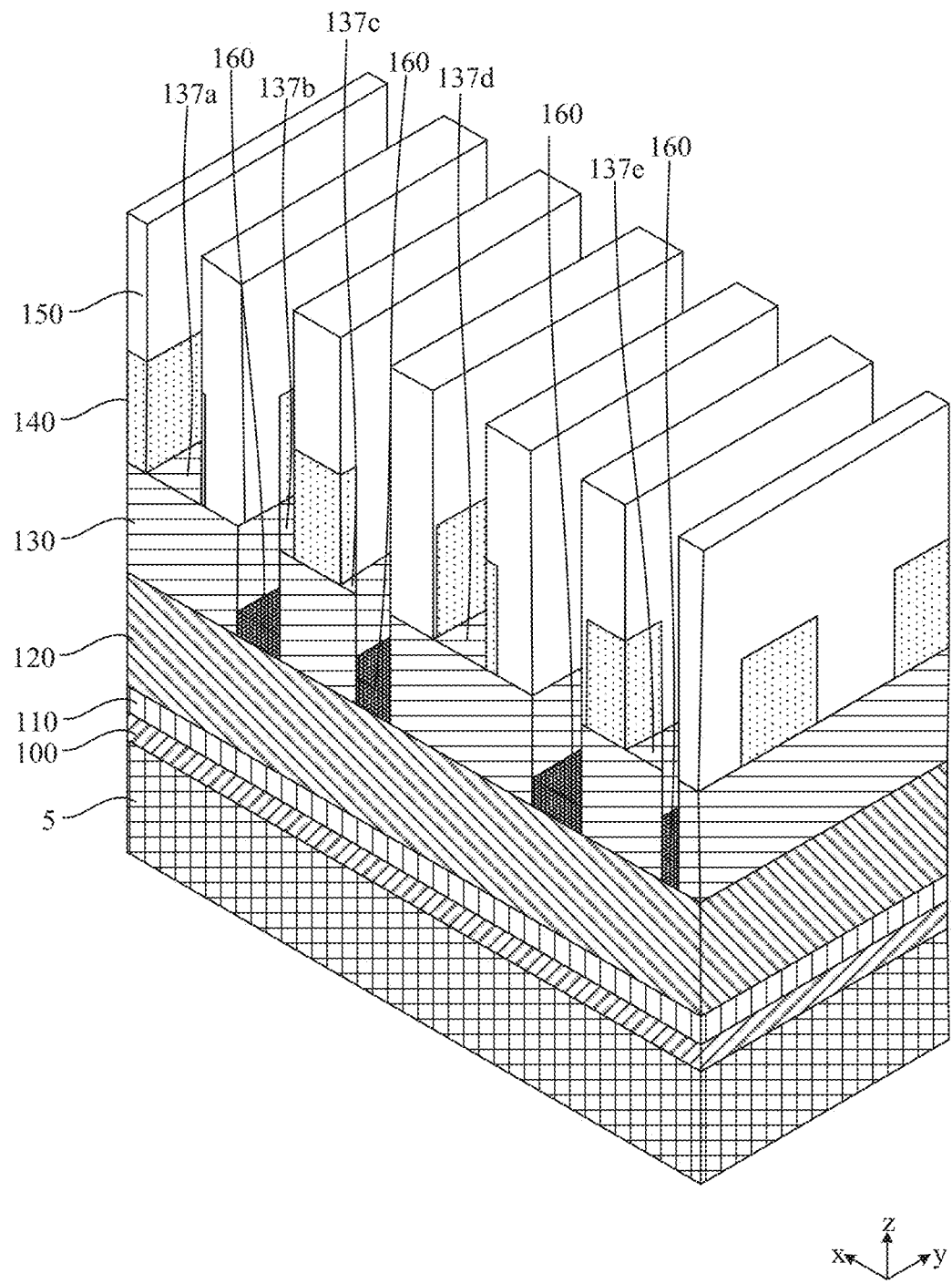
FIGS. 8A-8C illustrate a step of a method of forming a wafer of the disclosure, in accordance with some embodiments.
Figure 8B:
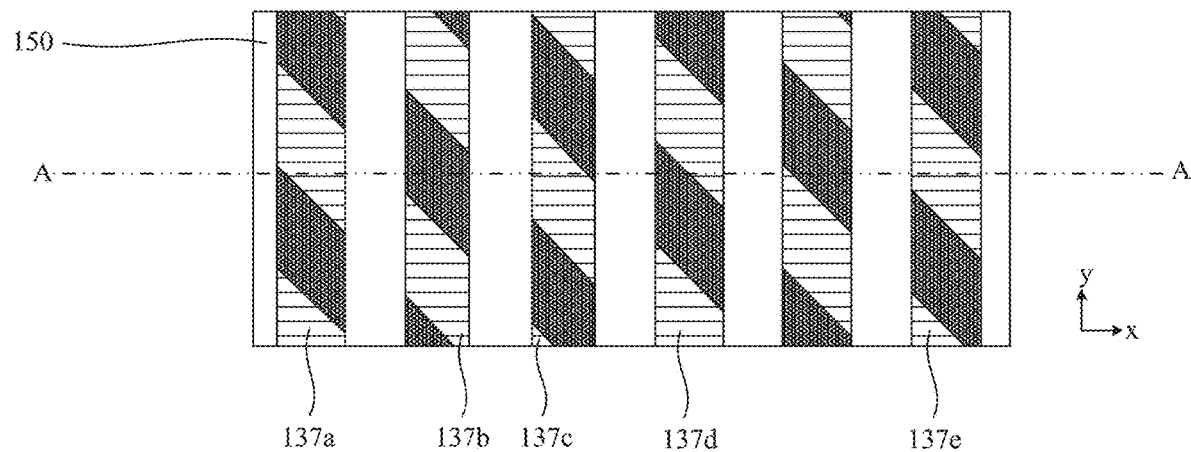
Figure 8C:
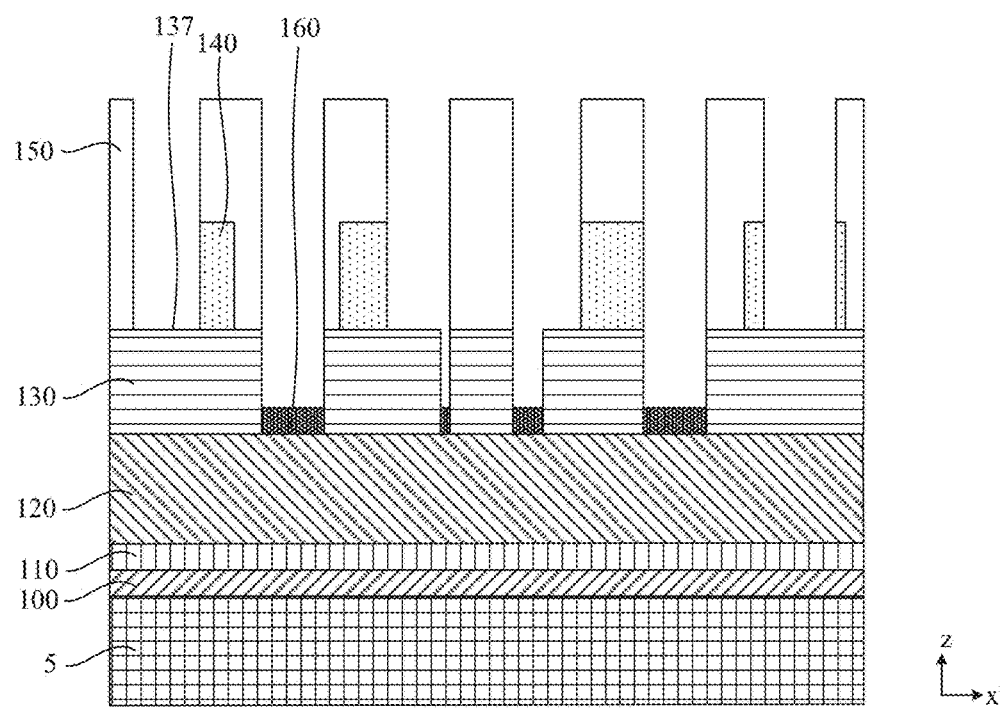

As shown in FIGS. 8A-8C, portions 137 (e.g., 137a-137d) of the second hardmask 130 are exposed by removing (e.g., by etching) exposed portions 145 of the third hardmask 140.

Figure 9A:
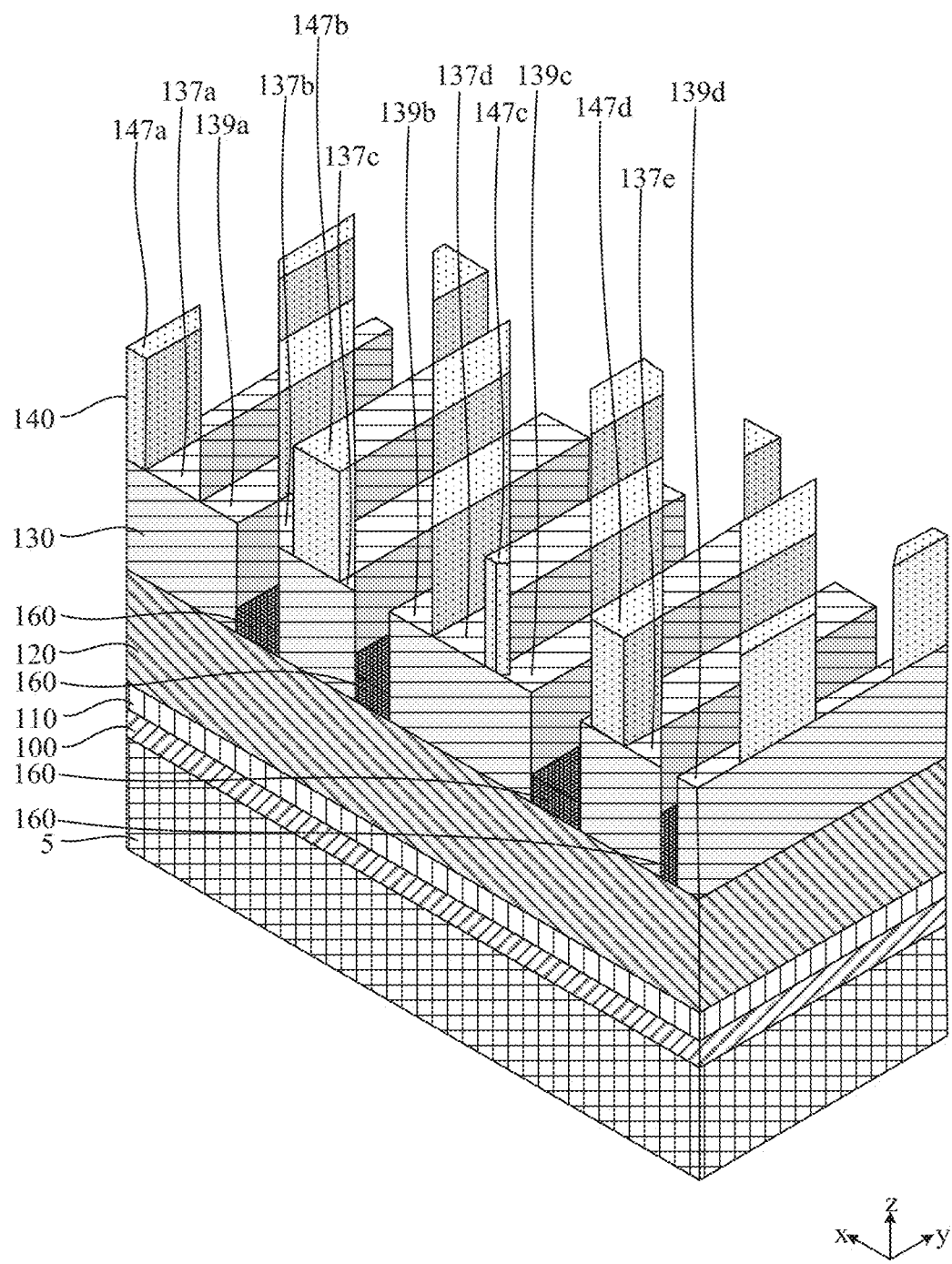
FIGS. 9A-9C illustrate a step of a method of forming a wafer of the disclosure, in accordance with some embodiments.
Figure 9B:
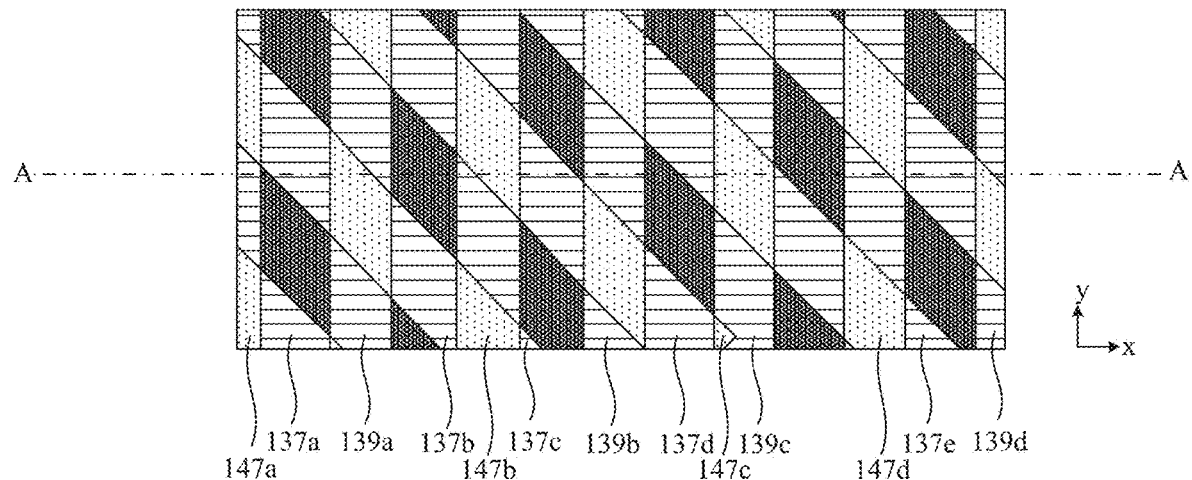
Figure 9C:
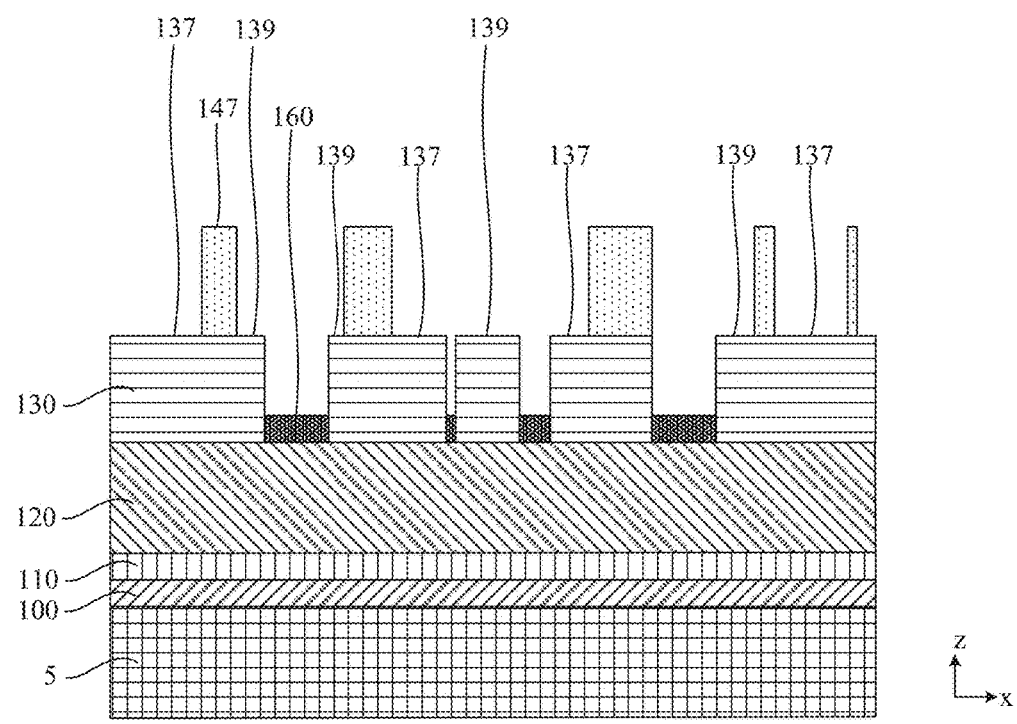

As shown in FIGS. 9A-9C, the fourth hardmask 150 is then removed (e.g., etched) to expose portions 139 (e.g., 139a-139d) of the second hardmask 130 and portions 147 (e.g., 147a-147e) of the third hardmask 140.

Figure 10A:
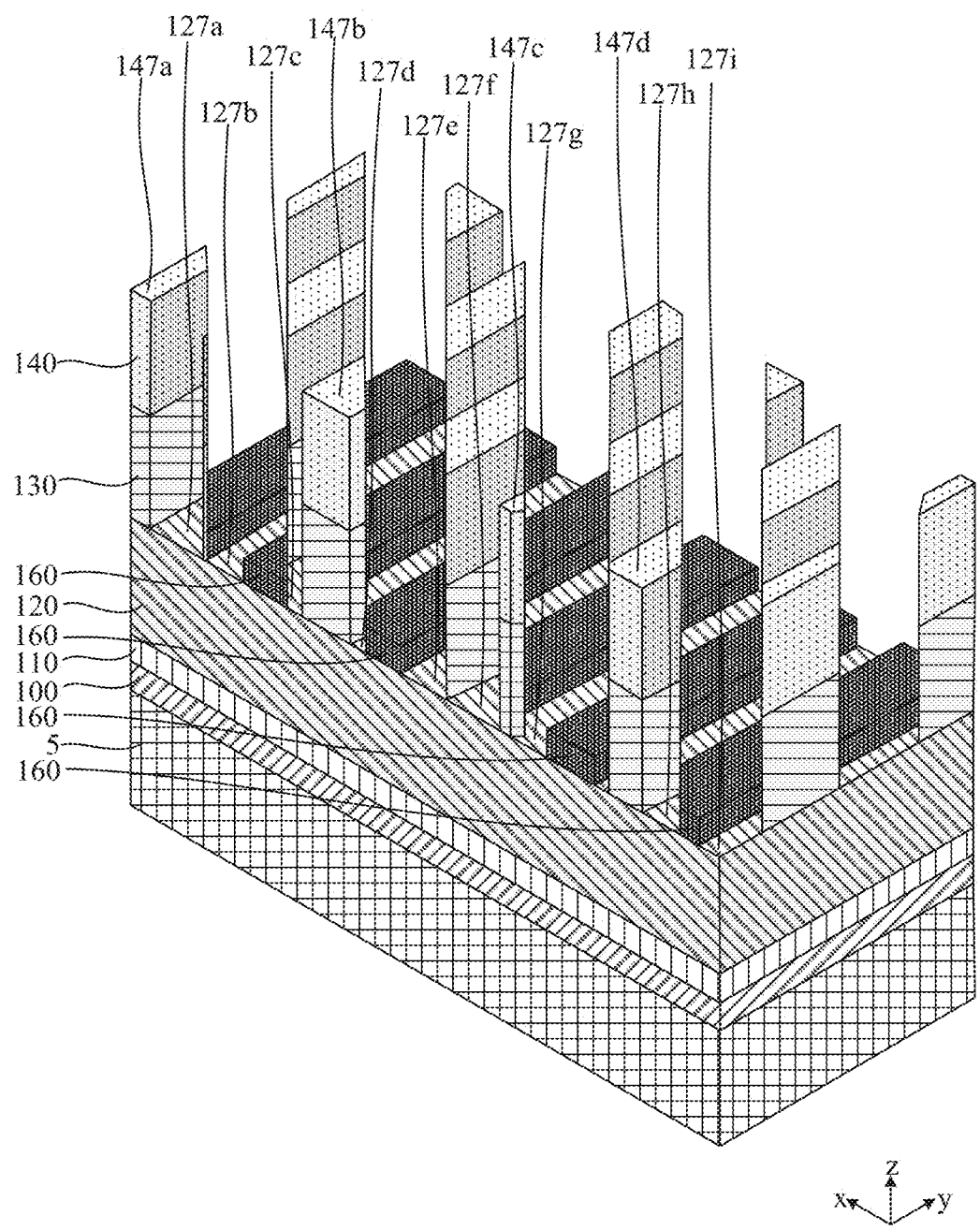
FIGS. 10A-10C illustrate a step of a method of forming a wafer of the disclosure, in accordance with some embodiments.
Figure 10B:
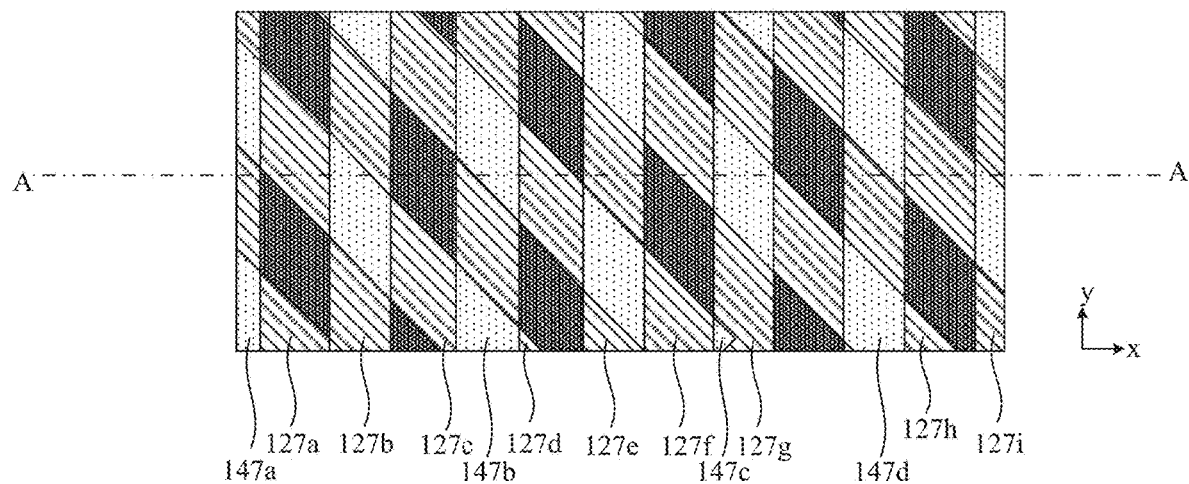
Figure 10C:
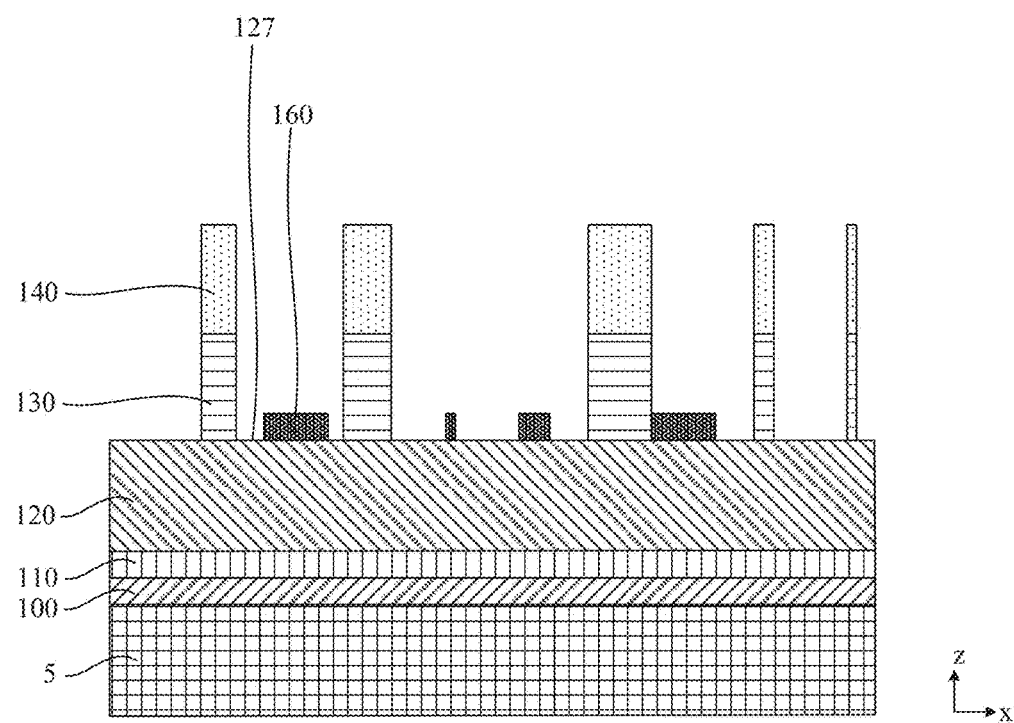

The exposed portions 137, 139 of the second hardmask are then removed (e.g., etched) to expose portions 127 (e.g., 127a-127i) of the first hardmask 120, as shown in FIGS. 10A-10C.

Figure 11A:
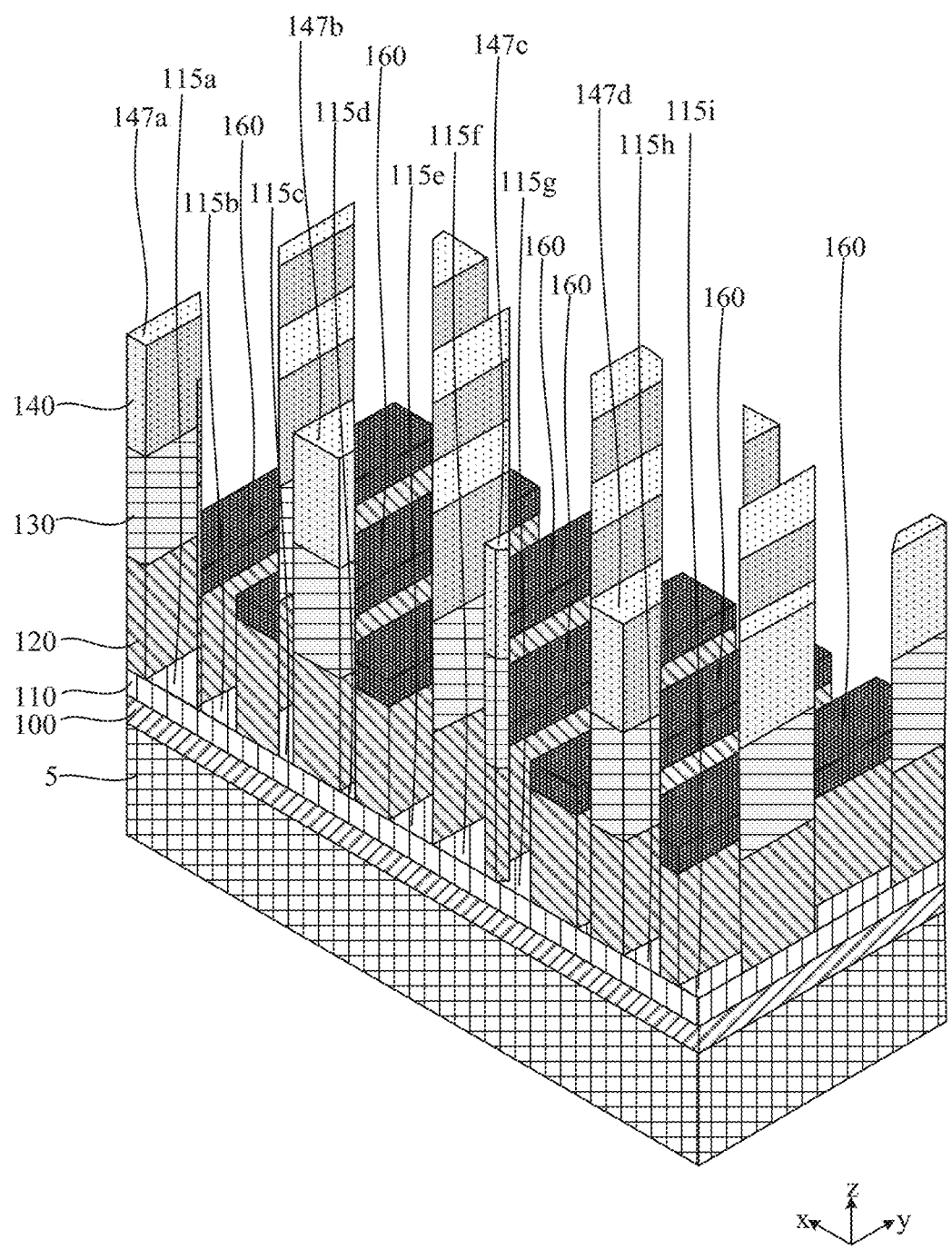
FIGS. 11A-11C illustrate a step of a method of forming a wafer of the disclosure, in accordance with some embodiments.
Figure 11B:
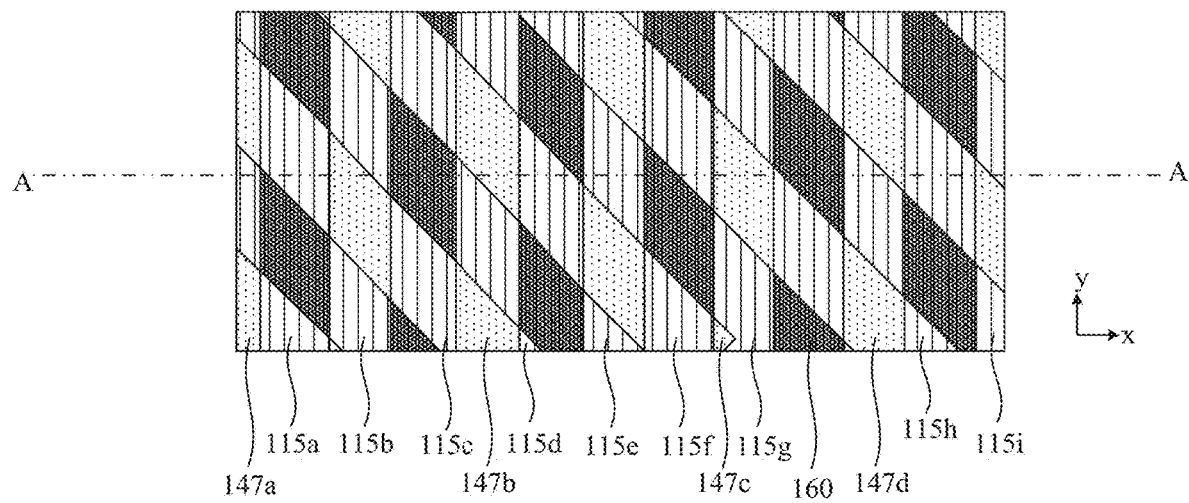
Figure 11C:
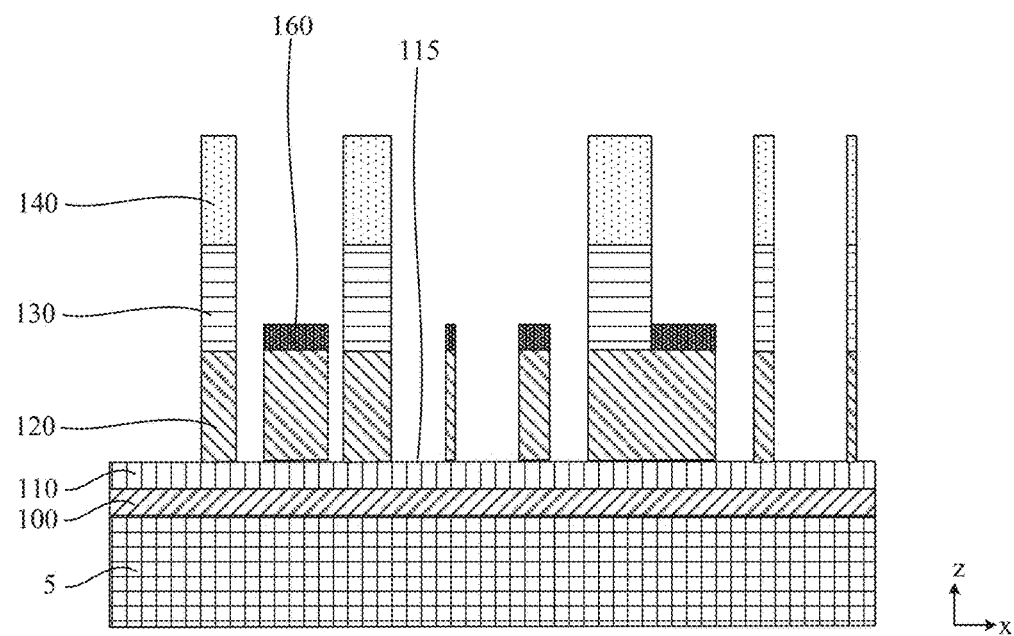

As shown in FIGS. 11A-11C, the exposed portions 127 of the first hardmask 120 are removed (e.g., etched) to expose portions 115 (e.g., 115a-115i) of the second insulating layer 110.

Figure 12A:
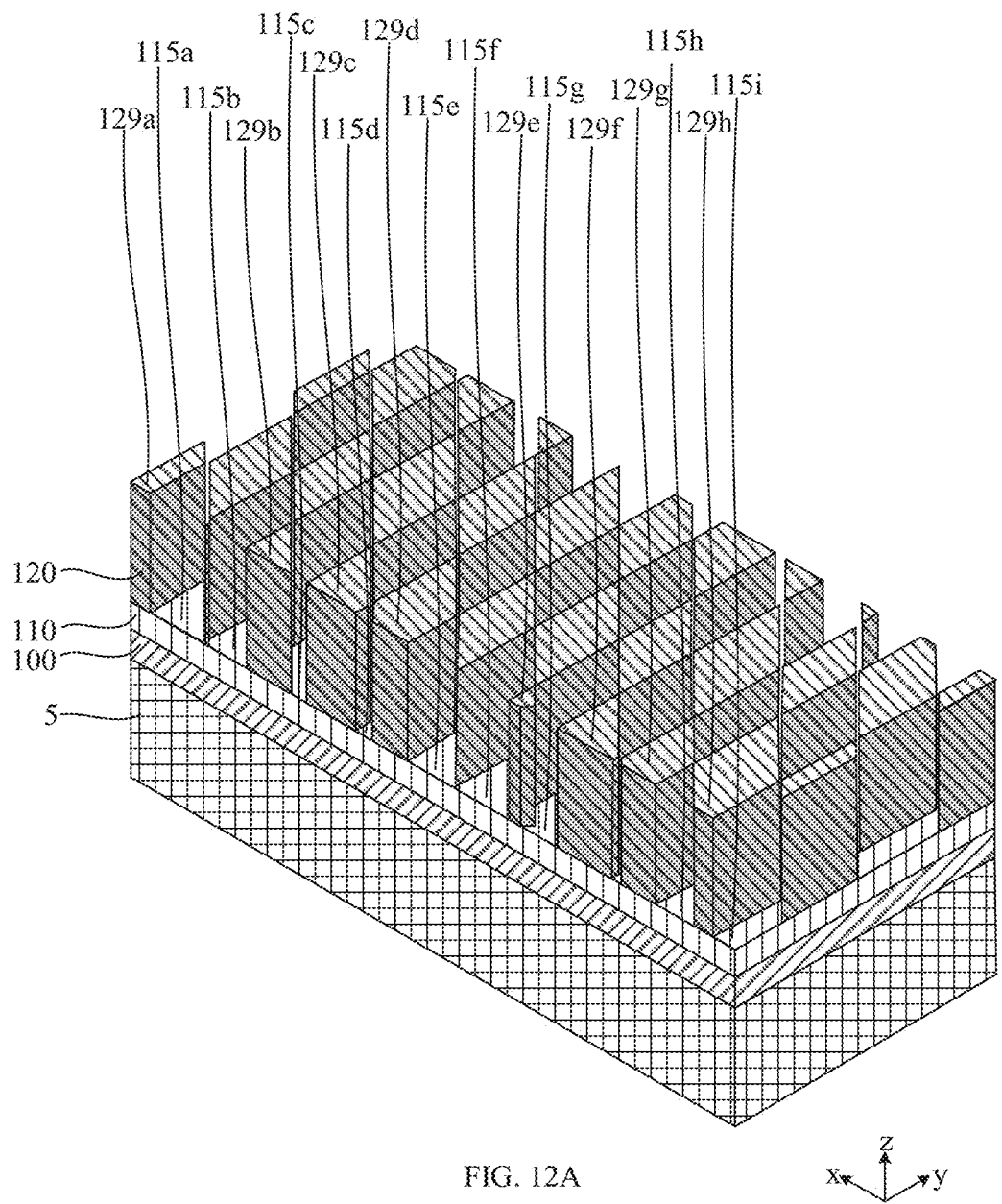
FIGS. 12A-12C illustrate a step of a method of forming a wafer of the disclosure, in accordance with some embodiments.
Figure 12B:
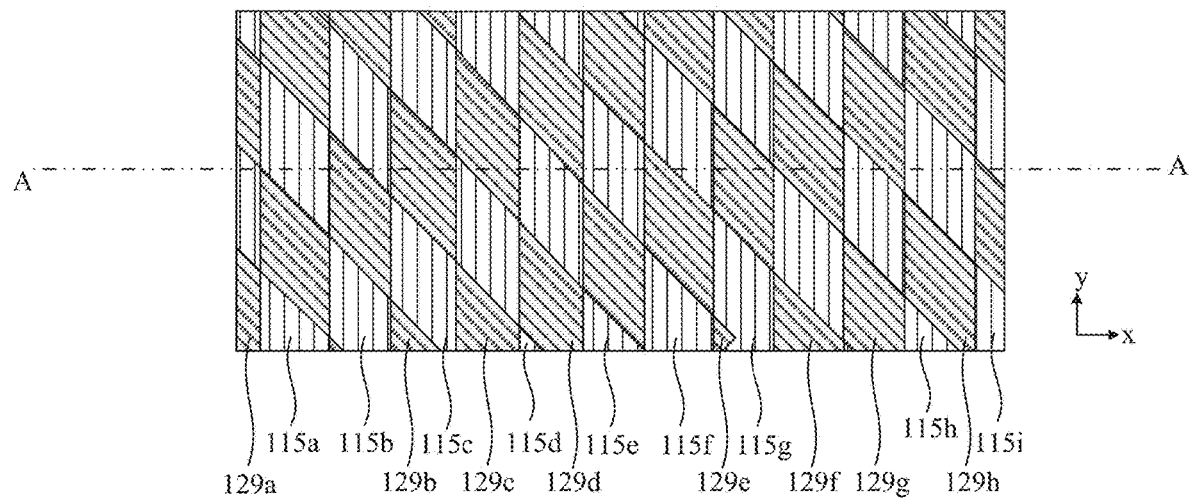
Figure 12C:
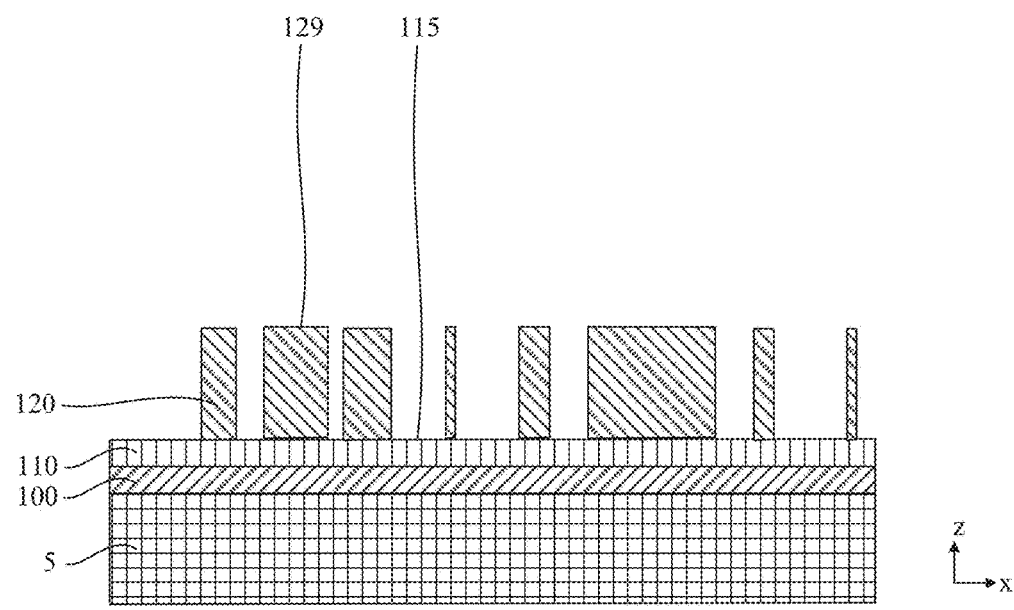

The fifth hardmask 160, the remaining portions of the third hardmask 140, and the remaining portions of the second hardmask 130 are removed (e.g., etched) to expose portions 129 of the first hardmask 120, as shown in FIGS. 12A-12C. In some embodiments, the fifth hardmask 150, the remaining portions of the third hardmask 140, and the remaining portions of the second hardmask 130 are removed in a single etching step. In other embodiments, the fifth hardmask 150, the remaining portions of the third hardmask 140, and the remaining portions of the second hardmask 130 are removed in two or more etching steps.

Figure 13A:
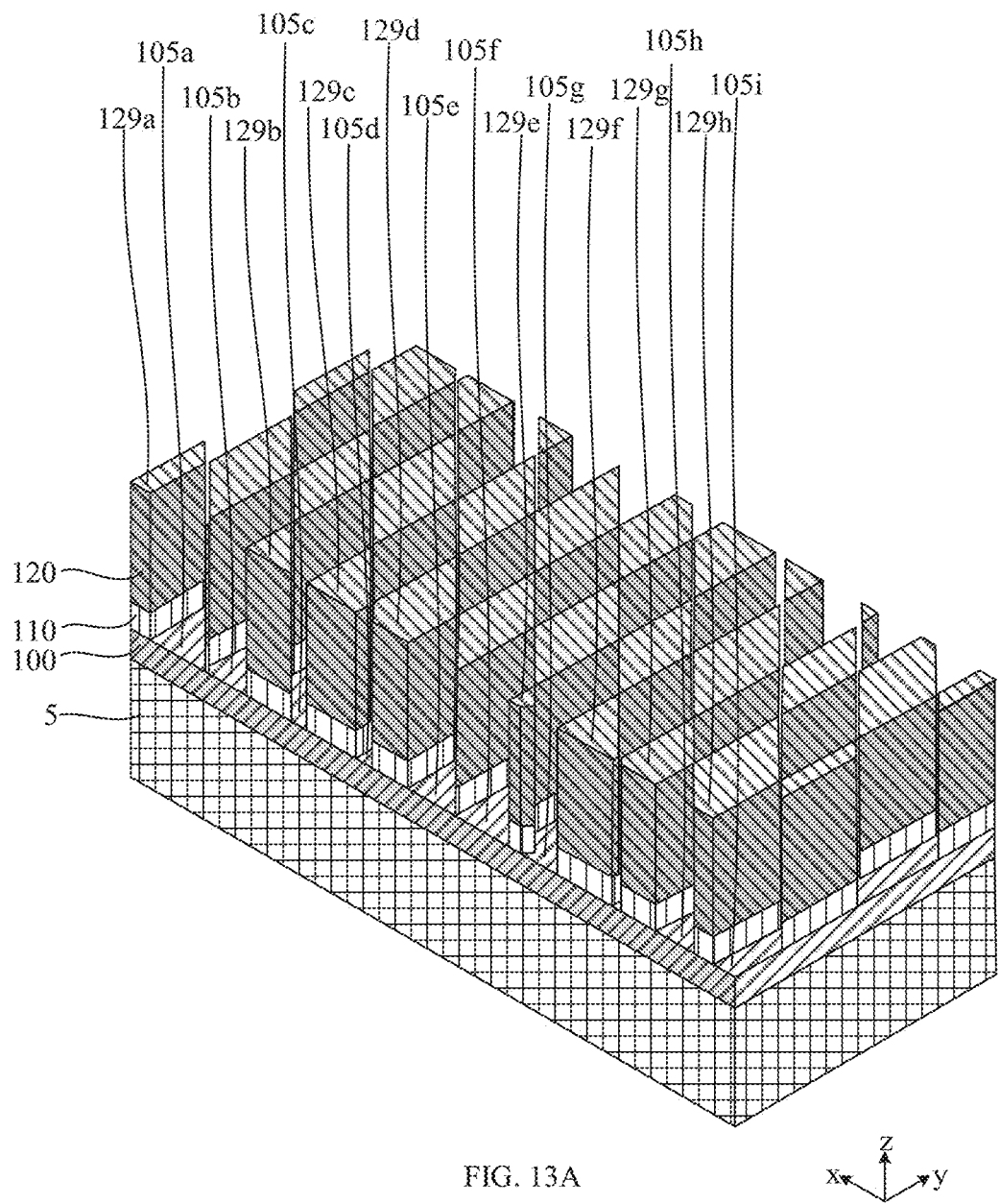
FIGS. 13A-13C illustrate a step of a method of forming a wafer of the disclosure, in accordance with some embodiments.
Figure 13B:
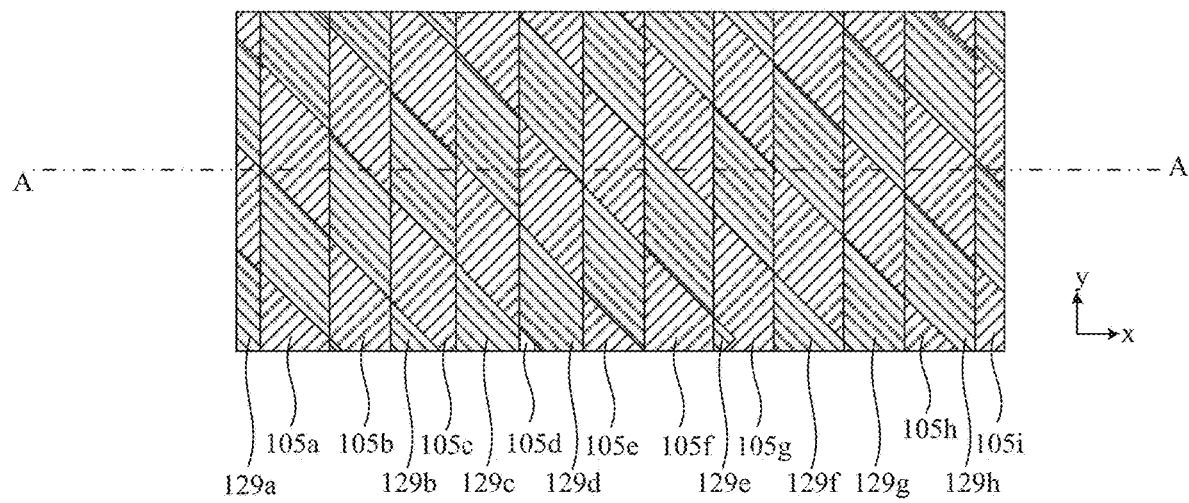
Figure 13C:
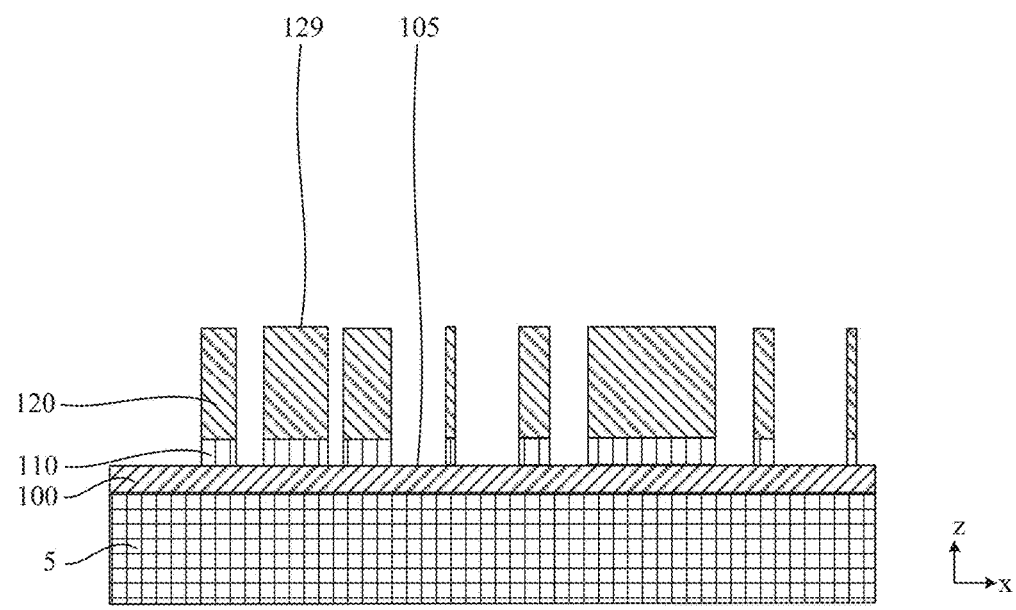

As shown in FIGS. 13A-13C, the exposed portions 115 of the second insulating layer 110 is removed (e.g., etched) to expose portions 105 (e.g., 105a-105i) of the first insulating layer 100.

Figure 14A:
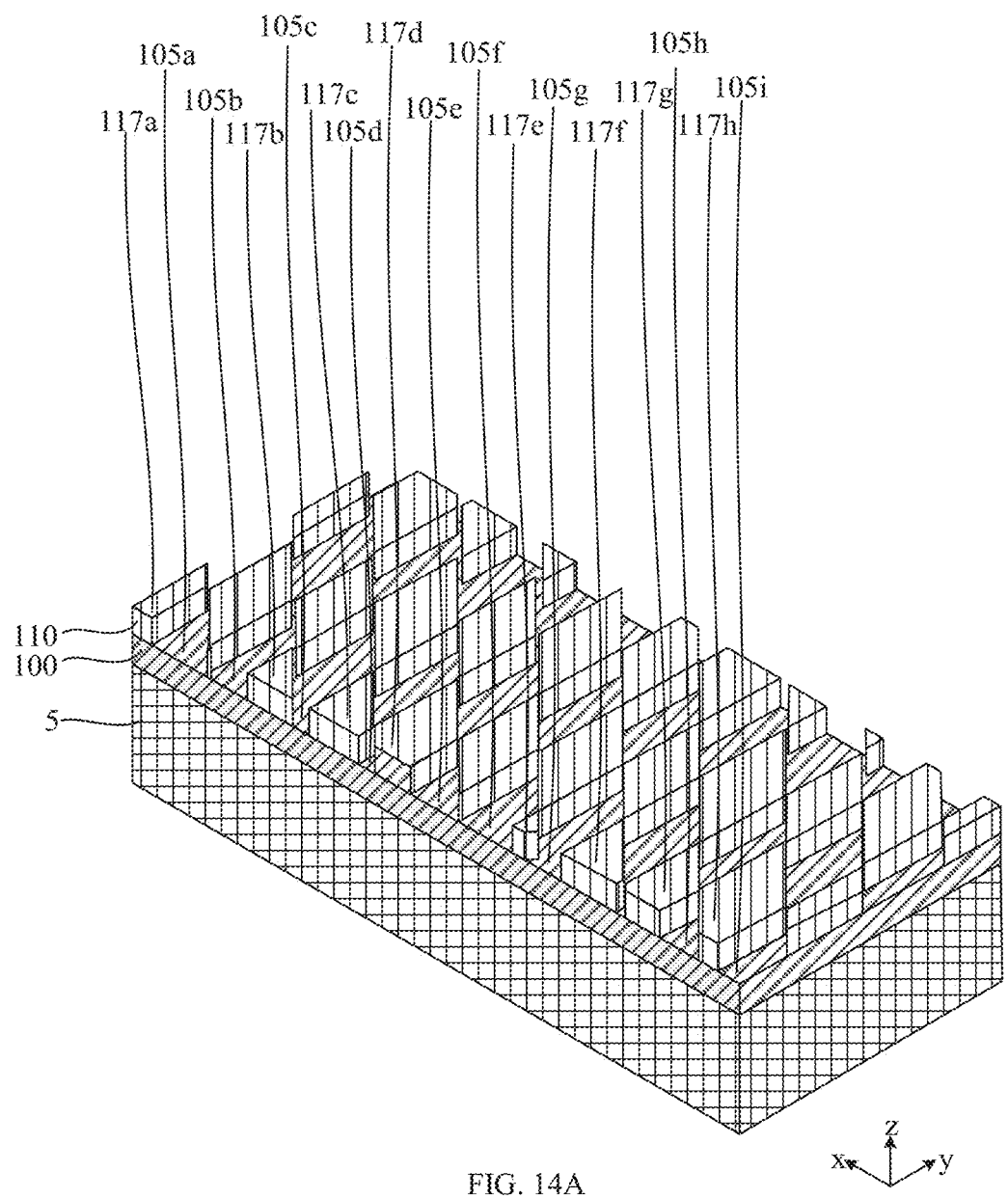
FIGS. 14A-14C illustrate a step of a method of forming a wafer of the disclosure, in accordance with some embodiments.
Figure 14B:
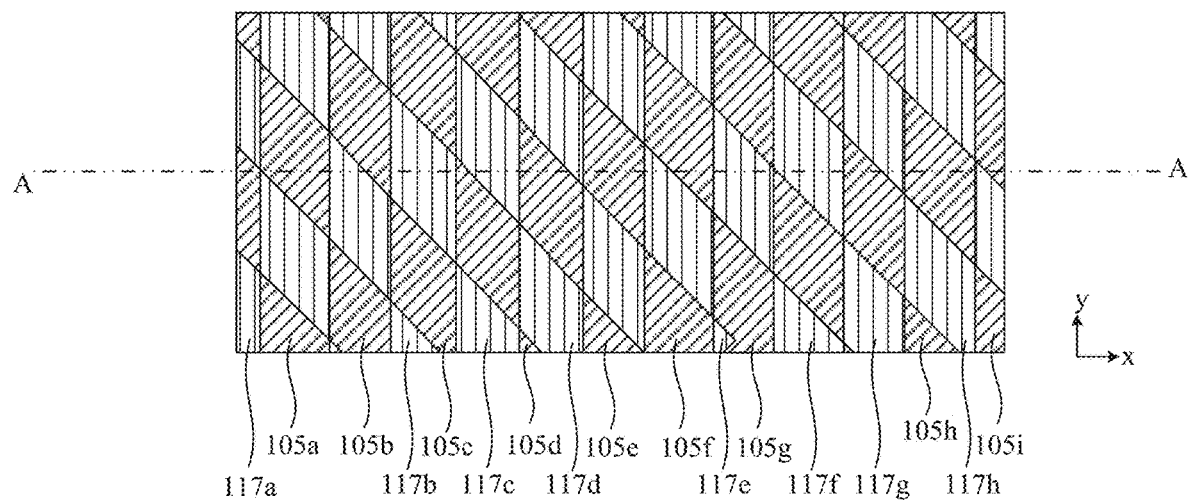
Figure 14C:
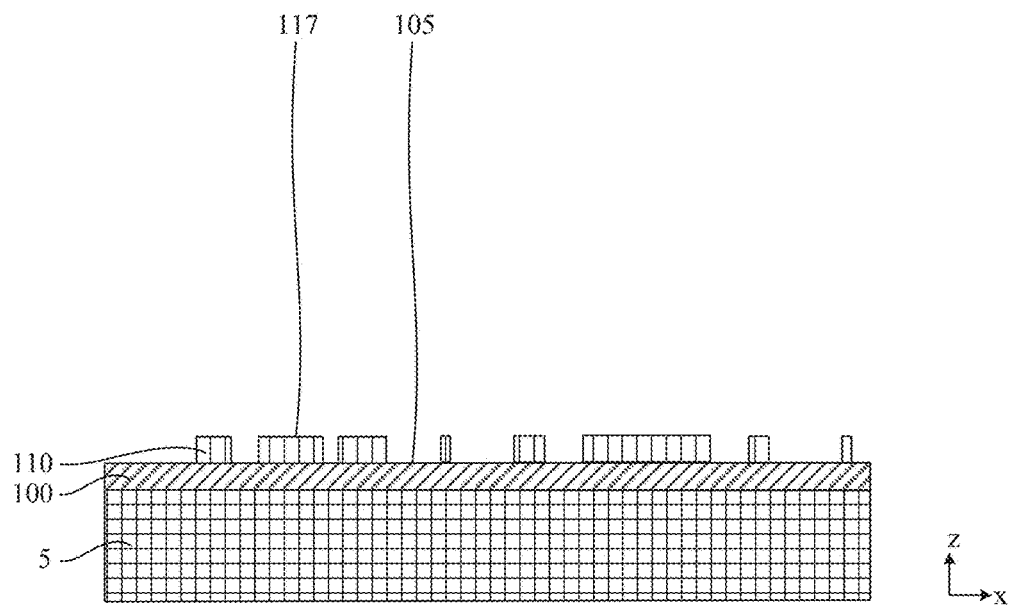

The remaining portions of the first hardmask 120 are then removed (e.g., etched) to expose portions 117 of the second insulating layer 110, as shown in FIGS. 14A-14C.

Figure 15A:
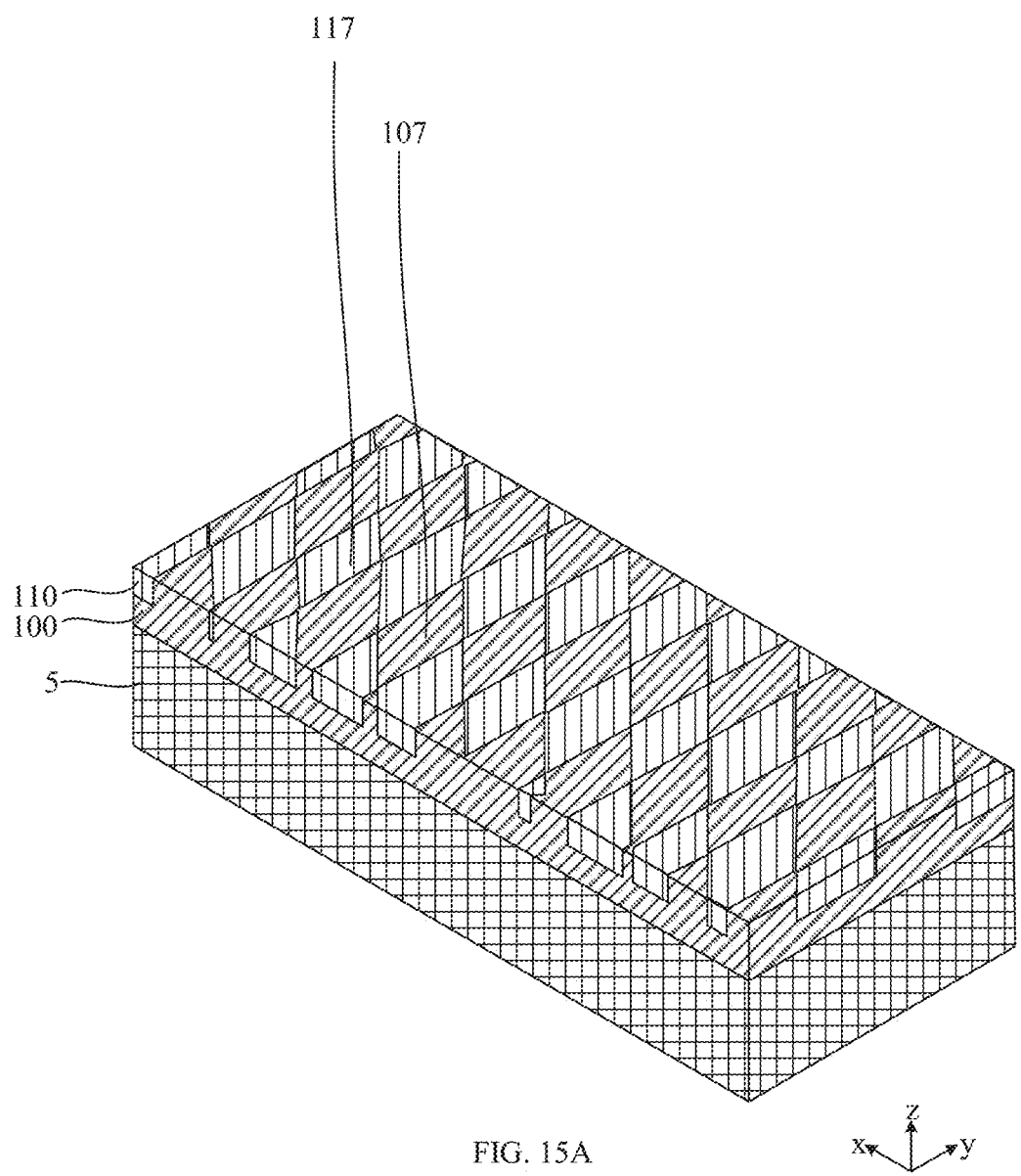
FIGS. 15A-15C illustrate a step of a method of forming a wafer of the disclosure, in accordance with some embodiments.
Figure 15B:
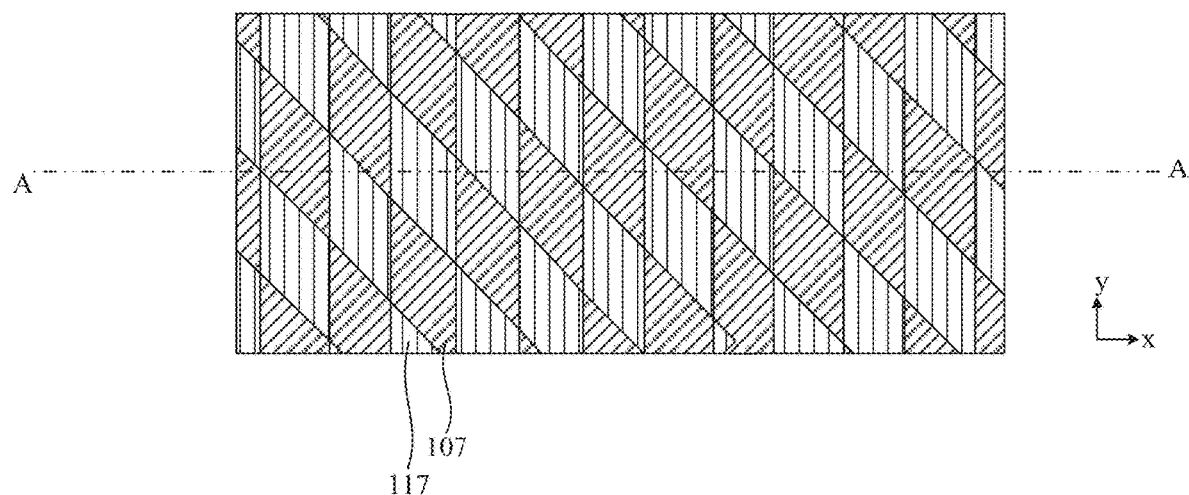
Figure 15C:
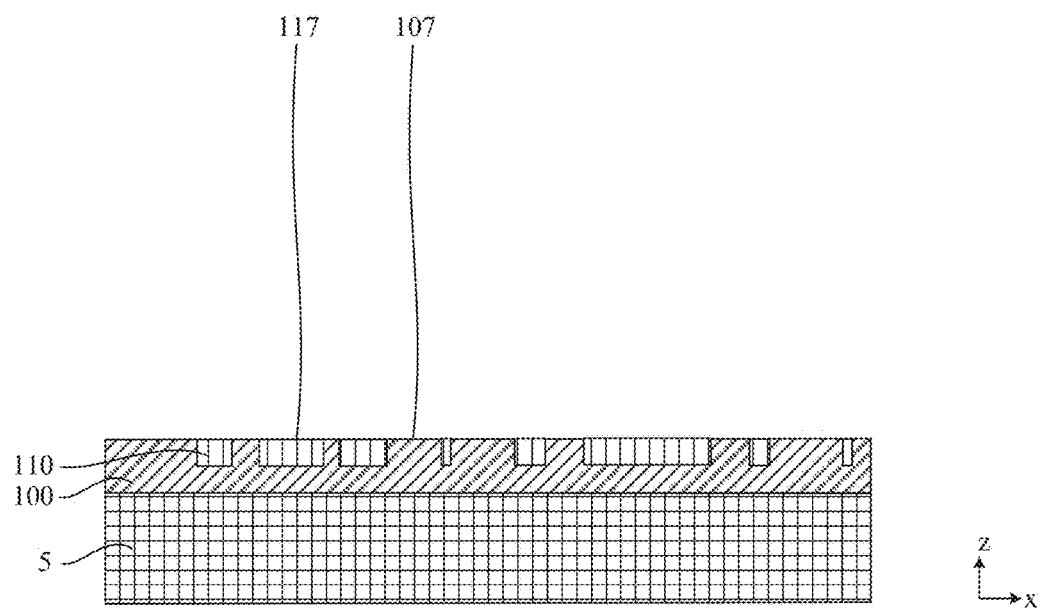

As shown in FIGS. 15A-15C, the first insulating material 107 is filled in the recesses between portions 117 of the second insulating layer 110.

Accordingly, embodiments of the present disclosure include methods comprising providing an intermediate wafer comprising: a semiconductor substrate 5; a first insulating layer 100 on the semiconductor substrate 5; a second insulating layer 110 on the first insulating layer 100; a first hardmask 120 on second insulating layer 110; a second hardmask 130 on the first hardmask 120; and a third hardmask 140 on the second hardmask 130; exposing first portions 133 of the second hardmask 130 by removing first portions of the third hardmask 140; depositing a fourth hardmask 150 on the third hardmask 140 and the first portions 133 of the second hardmask 130; exposing second portions 135 of the second hardmask 130 and second portions 145 of the third hardmask 140 by removing first portions of the fourth hardmask 150; exposing first portions 125 of the first hardmask 120 by removing the second portions 135 of the second hardmask 130; depositing a fifth hardmask 160 on the first portions 125 of the first hardmask 120; exposing third portions 137 of the second hardmask 130 by removing the second portions 145 of the third hardmask 140; exposing fourth portions 139 of the second hardmask 130 and third portions 147 of the third hardmask 140 by removing the fourth hardmask 150; exposing second portions 127 of the first hardmask 120 by removing third 137 and fourth 139 portions of the second hardmask 130; exposing first portions 115 of the second insulating layer 110 by removing the second portions 127 of the first hardmask 120; exposing third portions 129 of the first hardmask 120 by removing the second 130, third 140, and fifth 160 hardmasks; exposing first portions 105 of the first insulating layer 100 by removing the first portions 115 of the second insulating layer 110; exposing second portions 117 of the second insulating layer 110 by removing remaining portions of the first hardmask 120; and depositing a first material 107 on the first portions 105 of the first insulating layer 100. In various embodiments, the top surface of the wafer is planarized. For example, the top surface of the wafer can be planarized using chemical-mechanical planarization (CMP) using techniques known in the art. Accordingly, portions 117 of the second insulating layer 110 are co-planar with areas of the first insulating material 107. In various embodiments, the areas of the second insulating layer 110 are alignment areas 30 and areas of the first insulating material 107 are spacing areas 60.

Figure 16:
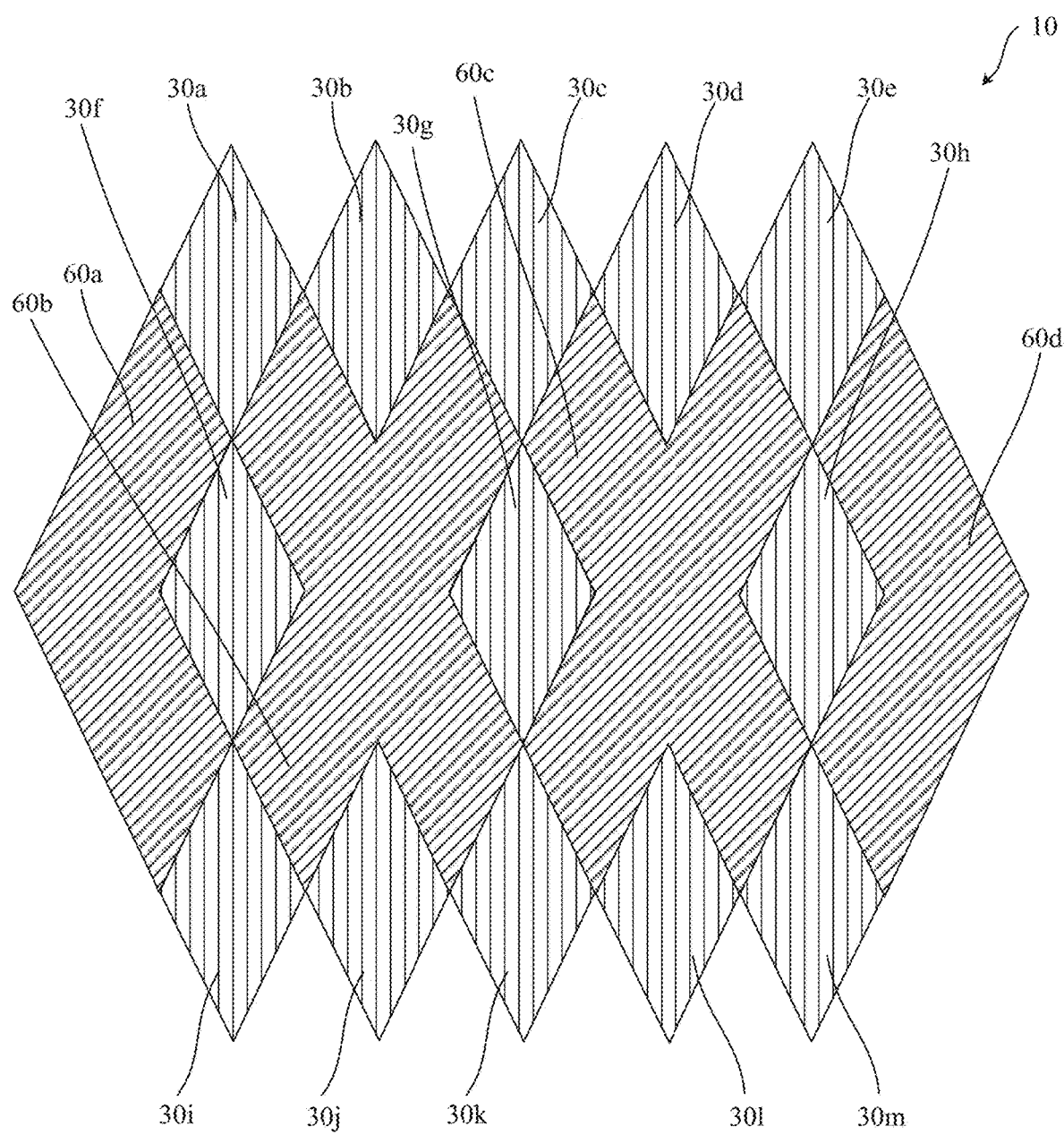
FIG. 16 illustrates a wafer of the disclosure, in accordance with some embodiments.

A further exemplary arrangement of a plurality of alignment areas 30a-30m and a plurality of spacing areas 60a-60d on a surface of a wafer is shown in FIG. 16. As described above, each alignment area 30a-30m has four edges, each of which contacts a spacing area. In various embodiments, an alignment area 30b, 30d, 30f-30h, 30j, 30l contacts two spacing areas. In various embodiments, an alignment area 30a, 30c, 30e, 30i, 30k, 30m contacts four spacing areas.

Figure 17:
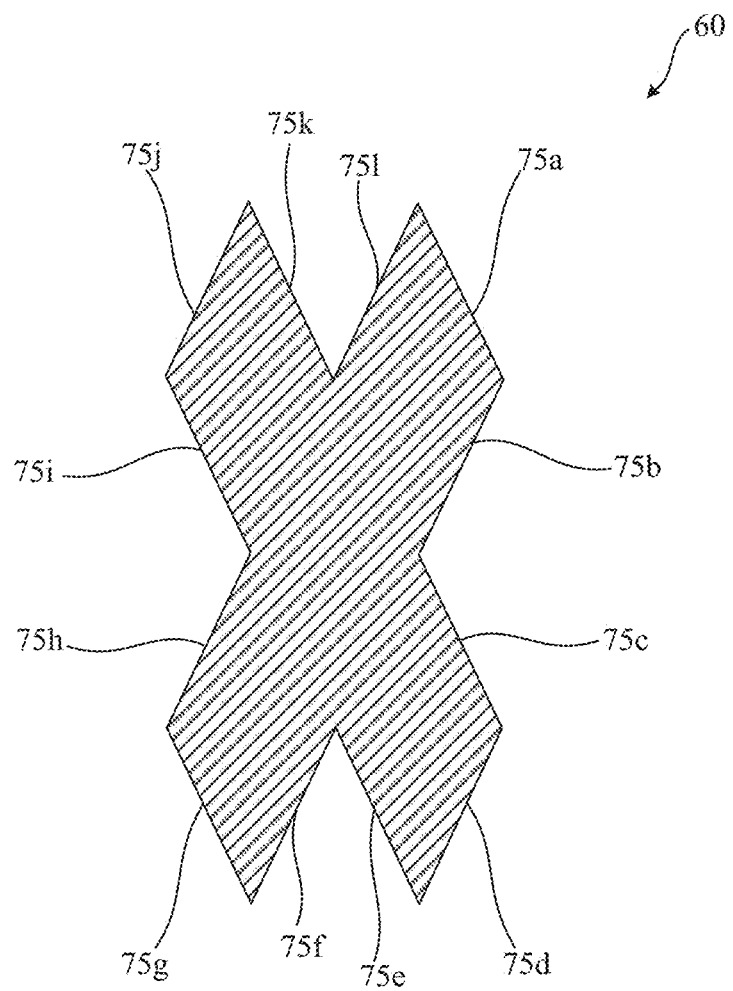
FIG. 17 illustrates an enlarged view of a spacing area, in accordance with some embodiments.

An exemplary spacing area 60 is shown in FIG. 17. In such embodiments, a spacing area 60 has more than four edges (e.g., six edges). In some embodiments, a spacing area 60 may have 12 edges 75a-75l. In particular embodiments, a spacing area 60 has an X-shape.

Returning to FIG. 16, in certain embodiments, some of the spacing areas on a wafer may have one shape and other spacing areas may have another shape. For example, spacing area 60d has a V-shape and spacing area 60c has an X-shape. Wafer 10 of FIG. 16 could be made using any suitable techniques (e.g., electron beam lithography, photolithographic methods, and the methods described above for producing spacing areas and alignment areas that exhibit different surface charges, etc.). In embodiments, wafer 10 is made using electron beam lithography using techniques known in the art.

Figure 18:
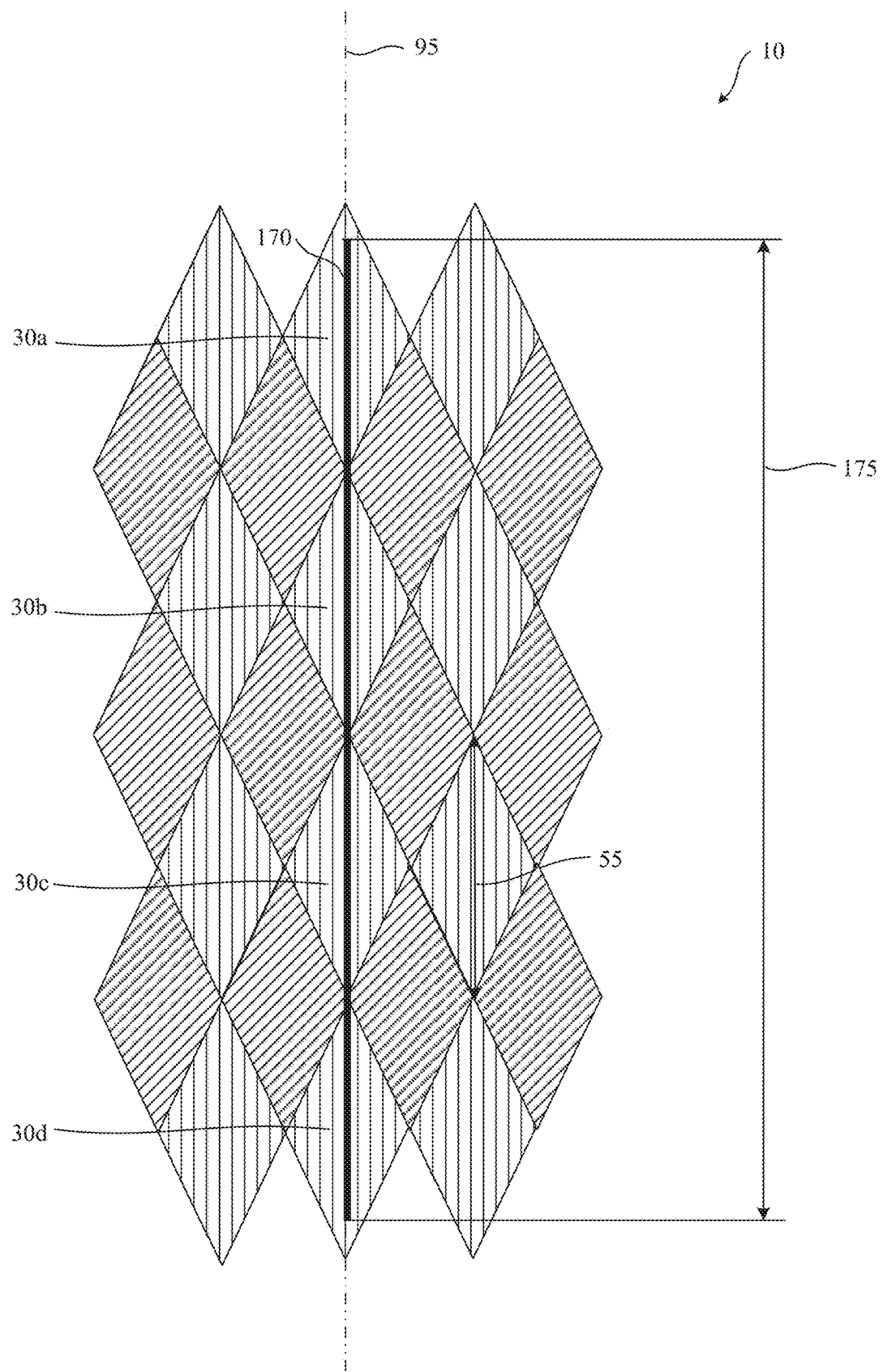
FIG. 18 illustrates a method of aligning a carbon nanotube on a wafer of the disclosure, in accordance with some embodiments.

Embodiments of the present disclosure further include methods of aligning a carbon nanotube (CNT) on a wafer 10 of the disclosure, as shown in FIG. 18. In various embodiments, a CNT 170 is deposited onto a surface of a wafer 10.

In embodiments, a CNT 170 (e.g., a single walled CNT) is provided in a solution. Such a solution may be provided by any suitable method. For example, it could be obtained from manufacturers such as CHASM Advanced Materials, Inc., Canton, Mass. or other suitable suppliers. In embodiments, a CNT 170 in a solution is applied to the surface of a wafer 10. In some embodiments, methods of the disclosure may comprise purifying a CNT solution to remove some or all of a particular type of CNT 170 (e.g., semiconducting or metallic). For example, CNTs could be purified, i.e., sorted by electronic type, using polymer extraction techniques (e.g., using poly((9,9-dioctylfluorenyl-2,7-diyl)-alt-co-(6,6'-(2,2'-bipyridine)))) in a sonication and centrifugation process). In specific embodiments, a CNT solution is purified by dissolving 10 mg poly((9,9-dioctylfluorenyl-2,7-diyl)-alt-co-(6,6'-(2,2'-bipyridine))) in 10 ml of toluene with gentle heating (~90° C.), approximately 20 mg of single walled CNTs is then added to the toluene solution and sonicated with a 6-mm sonication tip (Sonics VCX 250) for 30 min at 1 sec pulses while being cooled in a water bath (-13° C.). Following sonication, the solution is centrifuged for 10 min at 15,000 r.p.m. in a SW T41 rotor (Beckman). The top 90% of the solution is then collected and used.

In further embodiments, CNTs 170 in a solution may be concentrated or diluted to a desired concentration of CNTs to surfactant. CNTs 170 in a solution can be concentrated using any suitable filtering methods, e.g., dialysis or other techniques that utilize semipermeable substrates that exhibit different diffusion rates with respect to the CNTs and surfactant(s).

In various embodiments, a CNT 170 has a surface charge that is opposite to the surface charge of the alignment area 30. For example, if a CNT 170 has a positive surface charge the alignment area 30 has a negative surface charge, and vice versa. In embodiments, a surface charge of a CNT 170 is due to a surfactant (e.g., a polymer, a bonded functional group, etc.) on the surface of the CNT 170. For example, the surfactant may be a dialkyl homopolymers. In embodiments, a suitable anionic surfactant may be used (e.g., sodium dodecyl sulphate, etc.). In specific embodiments, the anionic surfactant is sodium dodecyl sulphate. In other embodiments, a suitable cationic surfactant may be used. In specific embodiments, the surfactant comprises hydroxamic acid. In some embodiments, the CNT 170 is functionalized with DNA.

In embodiments, a CNT is associated with a surfactant by mixing a solution containing the surfactant with a CNT solution. In some embodiments, the solution with the CNT and the surfactant is cooled while being mixed.

Figure 19:
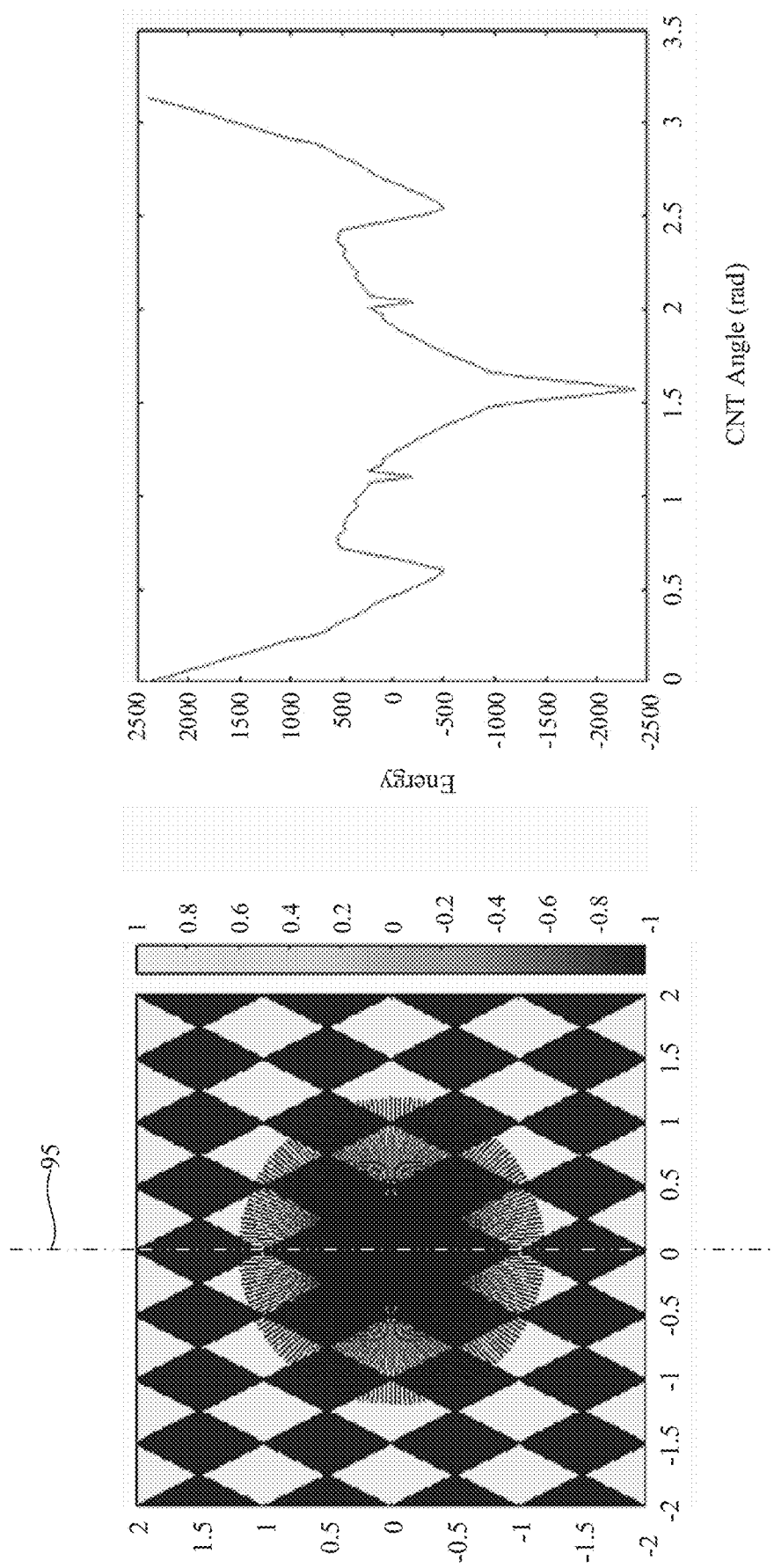
FIG. 19 shows the results of a calculation of energy versus position for a CNT on a wafer of the present disclosure.

In various embodiments, a CNT 170 is a semiconducting CNT 170. In other embodiments, a CNT 170 is a metallic CNT 170. In particular embodiments, a CNT solution includes metallic and semiconducting CNTs 170. In various embodiments, a CNT 170 is a single walled CNT. In other embodiments, a CNT 170 is a multi-walled CNT. In embodiments, a CNT 170 aligns itself along common diagonal 95 once deposited onto the surface of the wafer 10. A CNT 170, which has a surface charge of a first polarity, that is deposited onto the wafer 10, which has a surface charge of a second polarity, will align itself such that the CNT is in the minimum energy position. In this case, the minimum energy position correlates with the position in which the CNT has the largest area in contact with the alignment area. As shown in FIG. 19, a calculation of energy versus position shows that the minimum energy position for a CNT is at an angle of $\pi/2$. In other words, the minimum energy position for a CNT is to be aligned along common diagonal 95.

Accordingly, embodiments of the present disclosure include methods comprising providing a first wafer comprising: (i) a plurality of alignment areas having a first surface charge of a first polarity, each alignment area of the plurality of alignment areas having a first diagonal between a first vertex and a second vertex, the first diagonal extending in a first direction; and (ii) a plurality of spacing areas having a second surface charge of a second polarity that is different than the first polarity, the four edges of each alignment area of the plurality of alignment areas abutting at least one spacing area of the plurality of spacing areas; and depositing a first carbon nanotube onto the first wafer such that the first carbon nanotube is positioned on a first alignment area of the plurality of alignment areas, the first carbon nanotube extending in the first direction along the first diagonal of the first alignment area.

Returning to FIG. 18, in various embodiments, the length 175 of the CNT 170 is more than twice the length of diagonal 55. In other words, a CNT 170 aligned along common diagonal 95 overlaps at least three alignment areas 30a-30c. In embodiments, the length 175 of the CNT 170 is at least about 12.6 nm. In some embodiments, the length 175 of the CNT 170 is at least about 20.9 nm. In some embodiments, the length 175 of the CNT 170 is at least about 41.9 nm. In some embodiments, the length 175 of the CNT 170 is at least about 62.6 nm. In some embodiments, the length 175 of the CNT 170 is at least about 84 nm. In some embodiments, the length 175 of the CNT 170 is at least about 100 nm. In some embodiments, the length 175 of the CNT 170 is at least about 250 nm. In some embodiments, the length 175 of the CNT 170 is at least about 500 nm. In some embodiments, the length 175 of the CNT 170 is at least about 1 micrometer. In some embodiments, the length 175 of the CNT 170 is at least about 2 micrometers.

Figure 20A:
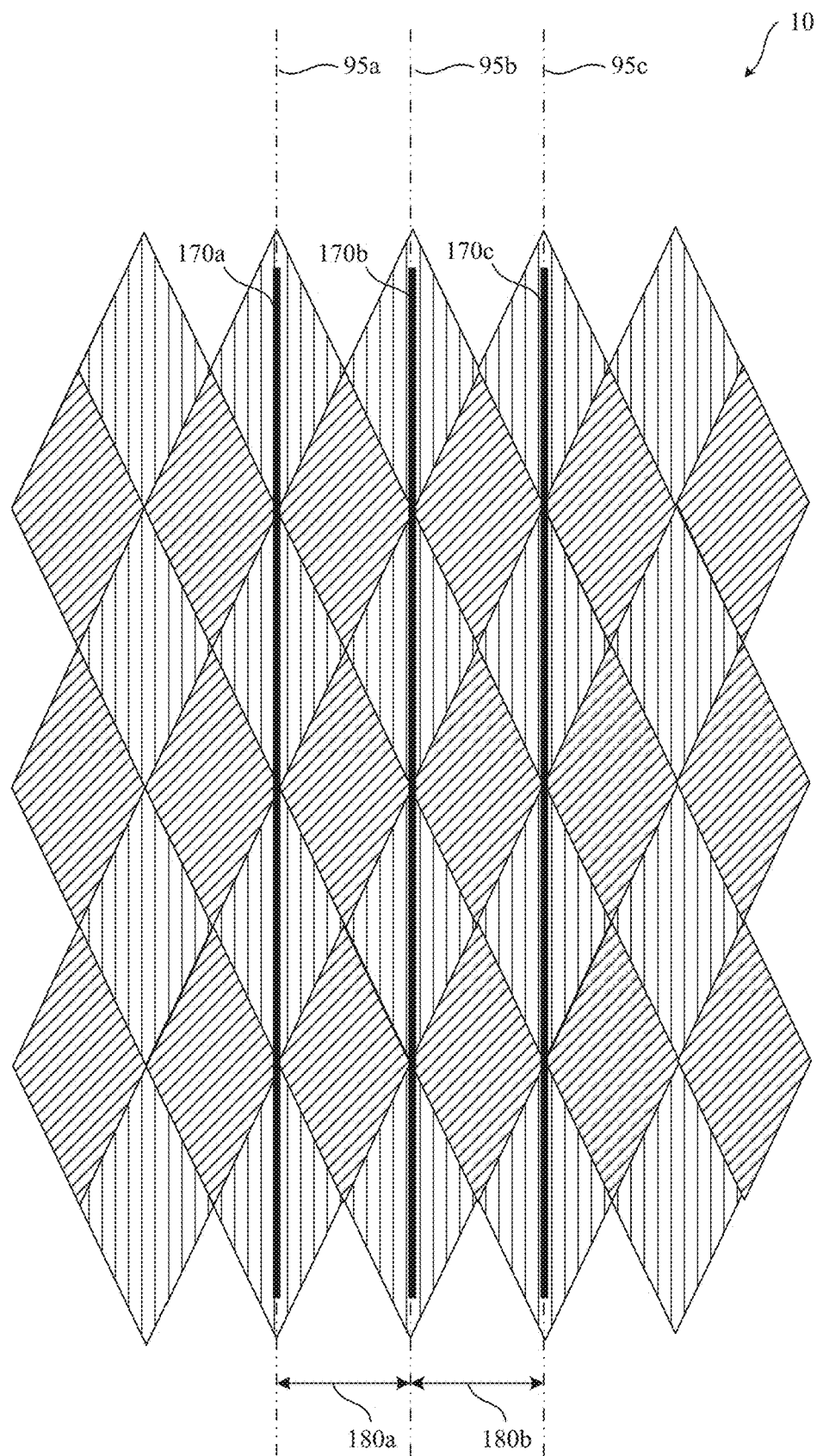
FIGS. 20A and 20B illustrate a method of aligning carbon nanotubes on two wafers of the disclosure, in accordance with some embodiments.
Figure 20B:
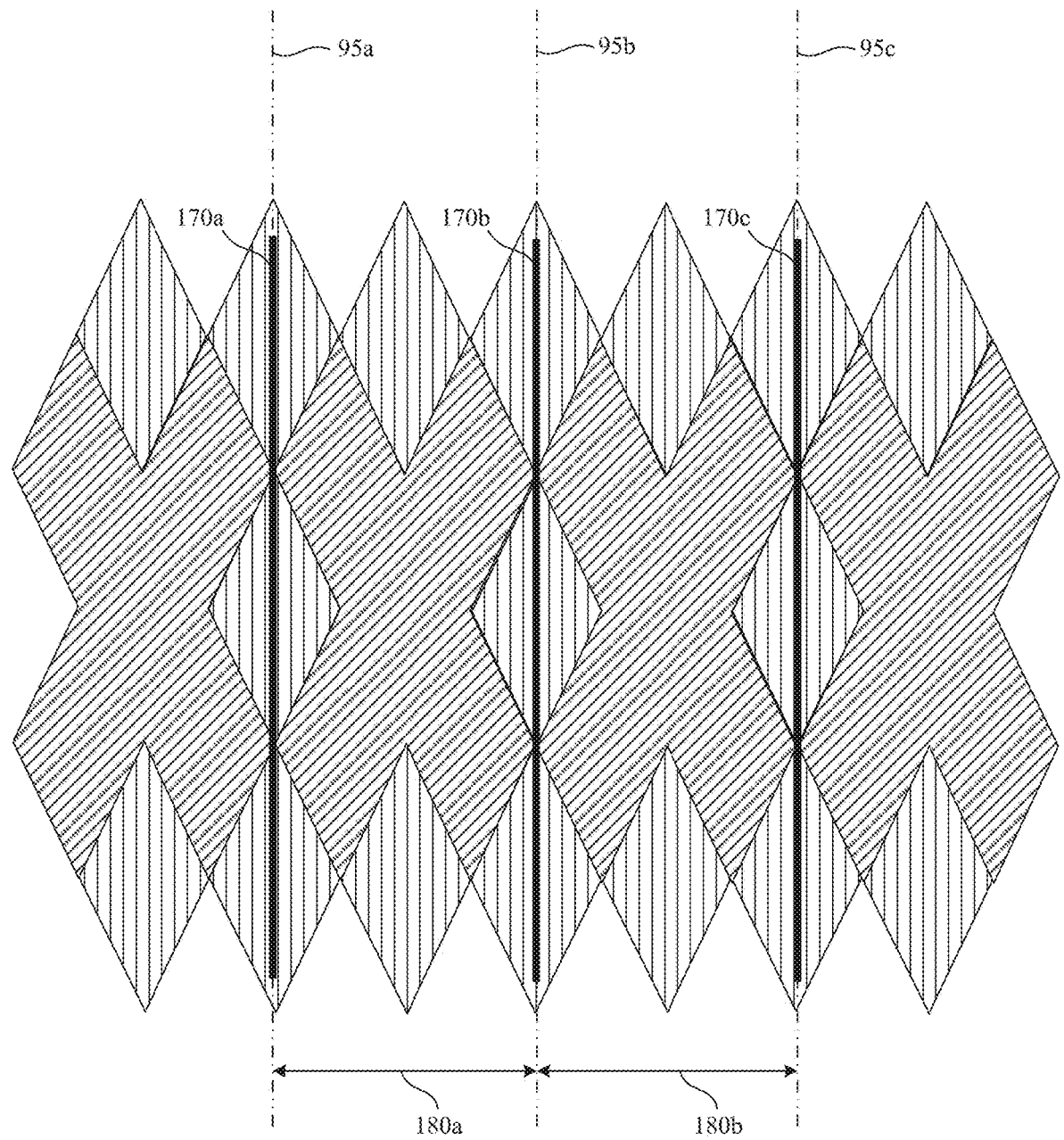

Methods of the present disclosure further include aligning more than one CNT 170 on a surface of a wafer 10 of the disclosure, as illustrated in FIG. 20A. Another embodiment of a method of aligning more than one CNT 170 on a surface of wafer 10 is shown in FIG. 20B.

In some embodiments, multiple CNTs 170a-170c are dispersed in a solution. The solution is then applied to the surface of the wafer 10. The CNTs 170a-170c align along diagonals 95a-95c, respectively. Any suitable number of CNTs 170 can be aligned using embodiments of the methods described herein. In various embodiments, at least one CNT 170 is aligned. In various embodiments, a plurality of CNTs 170 is aligned. In some embodiments, at least two CNTs 170 are aligned. In some embodiments, at least three CNTs 170 are aligned. In some embodiments, at least four CNTs 170 are aligned. In some embodiments, at least five CNTs 170 are aligned. In some embodiments, at least ten CNTs 170 are aligned. In some embodiments, at least 50 CNTs 170 are aligned. In some embodiments, at least 100 CNTs 170 are aligned. In some embodiments, at least 500 CNTs 170 are aligned. In some embodiments, at least 1,000 CNTs 170 are aligned. Embodiments of the present disclosure are not limited to the foregoing numbers of CNTs being aligned. In accordance with some embodiments of the present disclosure, the number of CNTs aligned is much greater than 1,000, e.g., 10,000, 100,000, 1,000,000, etc.

In some embodiments, the distance 180a between the first CNT 170a and the second CNT 170b ranges from about 3 nanometers (nm) to about 20 nm. In some embodiments, the distance 180a between the first CNT 170a and the second CNT 170b ranges from about 5 nm to about 15 nm. In some embodiments, the distance 180a between the first CNT 170a and the second CNT 170b is no more than 10 nm. In some embodiments, the distance 180a between the first CNT 170a and the second CNT 170b is less than 10 nm. In some embodiments, the distance 180a between the first CNT 170a and the second CNT 170b ranges from about 5 nm to about 10 nm.

In some embodiments, the distance 180b between the second CNT 170b and the third CNT 170c ranges from about 3 nanometers (nm) to about 20 nm. In some embodiments, the distance 180b between the second CNT 170b and the third CNT 170c ranges from about 5 nm to about 15 nm. In some embodiments, the distance 180b between the second CNT 170b and the third CNT 170c is no more than 10 nm. In some embodiments, the distance 180b between the second CNT 170b and the third CNT 170c is less than 10 nm. In some embodiments, the distance 180b between the second CNT 170b and the third CNT 170c ranges from about 5 nm to about 10 nm. In various embodiments, distance 180a is substantially the same as distance 180b.

A CNT aligned using a wafer 10 as described herein may be transferred from a wafer 10 to a second wafer using known methods. In some embodiments, a layer of a metal (e.g., copper, gold, etc.) is deposited over the surface of the wafer 10 and the aligned CNTs 170. Then, thermal release tape is applied on the metal layer. The thermal release tape, which is attached to the metal layer and CNTs 170, is removed and arranged on a second wafer. The thermal release tape is then heated to release the aligned CNTs 170 embedded in the metal layer onto the second wafer. The metal layer is then removed. After the thermal release tape and metal layer have been removed, the aligned CNTs 170 may be used in any manner desired.

In embodiments, a highly ordered arrangement of CNTs 170 is produced. This reduces bundling and allows for lithographically defining the distance between CNTs 170 (i.e., CNT to CNT pitch). By producing such an ordered arrangement of CNTs 170, the variability in the number of CNTs 170 in a single transistor is reduced.

The highly ordered arrangement of CNTs 170 could be used, for example, to form one or more transistors (e.g., FETs). In embodiments, the arrangement of CNTs 170 are used in back-end-of-line CMOS for interconnects. In some embodiments, the arrangement of CNTs 170 is used in thin film or flexible electronics. In some embodiments, the arrangement of CNTs 170 is used in nano-electro-mechanical switches. In some embodiments, the arrangement of CNTs 170 is used in EUV pellicle. In some such embodiments, the arrangement of CNTs 170 is used in EUV pellicle for EUV lithography. In some embodiments, the arrangement of CNTs 170 is used for gas sensing. In some embodiments, the arrangement of CNTs 170 is used for filtration. In some embodiments, the arrangement of CNTs 170 is used in quantum computing.

The present disclosure provides, in various embodiments, a wafer that includes quadrilateral alignment areas that have a surface charge, where the alignment areas are surrounded by other areas that have a surface charge with a different polarity.

Further embodiments of the present disclosure include methods comprising providing a wafer that includes a semiconductor substrate with layers of a first insulating material, a second insulating material, and a hardmask on the surface; patterning the hardmask such that openings in the hardmask expose portions of the layer of the second insulating material; etching the exposed portions of the second insulating material through the patterned hardmask to expose portions of the first insulating layer; removing the remainder of the hardmask layer; and depositing the first material on the exposed portion of the first insulating layer, which results in a final wafer that includes a plurality of first areas of the second material, each first area having four edges and being surrounded by a plurality of second areas of the first material.

Embodiments of the present disclosure further include methods comprising depositing a plurality of hardmasks and selectively removing portions of the hardmasks to form a wafer as described herein.

Additional embodiments of the present disclosure include methods including exposing first portions of a second hardmask from an intermediate wafer by removing first portions of the third hardmask, where the intermediate wafer includes a semiconductor substrate, a first insulating layer on the semiconductor substrate, a second insulating layer on the first insulating layer, a first hardmask on second insulating layer, a second hardmask on the first hardmask, a third hardmask on the second hardmask. Such methods include depositing a fourth hardmask on the third hardmask and the first portions of the second hardmask; exposing second portions of the second hardmask and second portions of the third hardmask by removing first portions of the fourth hardmask; exposing first portions of the first hardmask by removing the second portions of the second hardmask; depositing a fifth hardmask on the first portions of the first hardmask; exposing third portions of the second hardmask by removing the second portions of the third hardmask; exposing fourth portions of the second hardmask and third portions of the third hardmask by removing the fourth hardmask; exposing second portions of the first hardmask by removing third and fourth portions of the second hardmask; exposing first portions of the second insulating layer by removing the second portions of the first hardmask; exposing third portions of the first hardmask by removing the second, third, and fifth hardmasks; exposing first portions of the first insulating layer by removing the first portions of the second insulating layer; exposing second portions of the second insulating layer by removing remaining portions of the first hardmask; and depositing a first material on the first portions of the first insulating layer.

Embodiments of the present disclosure also include methods comprising depositing a CNT on a wafer that includes alignment areas that have a surface charge and a diagonal between two vertices, where the areas are surrounded by other areas that have a surface charge with a different polarity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   providing a first wafer comprising:
     a semiconductor substrate;
     a first insulating layer of a first material on the semiconductor substrate;
     a second insulating layer of a second material, which is different than the first material, on the first insulating layer;
     a first hardmask on second insulating layer;
   providing a patterned first hardmask, the patterned first hardmask including openings, the openings exposing a portion of the second insulating layer;
   etching the exposed portion of the second insulating layer;
   removing the patterned first hardmask; and
   depositing the first material on exposed portions of the first insulating layer to provide a second wafer comprising:
     a plurality of first areas of the second material, each first area of the plurality of first areas having four edges and a first diagonal between a first vertex and a second vertex, the first diagonal extending in a first direction; and
     a plurality of second areas of the first material, the four edges of each first area of the plurality of first areas abutting at least one second area of the plurality of second areas.

2. The method of claim 1, further comprising:
   depositing the first insulating layer on the semiconductor substrate;
   depositing the second insulating layer on the first insulating layer;
   depositing the first hardmask on the second insulating layer; and
   depositing second and third hardmasks on the second insulating layer.

3. The method of claim 1, further comprising:
   depositing the first hardmask on the second insulating layer;
   depositing a second hardmask on the first hardmask; and
   depositing a third hardmask on the second hardmask.

4. The method of claim 1, wherein the plurality of first areas each have a second diagonal between a third vertex and a fourth vertex, the second diagonal being shorter than the first diagonal.

5. The method of claim 4, wherein the plurality of second areas each have four edges, a first diagonal between a first vertex and a second vertex, and a second diagonal between a third vertex and a fourth vertex, the second diagonal being shorter than the first diagonal.

6. The method of claim 1, further comprising forming a coplanar surface by planarizing the wafer.

7. A method, comprising:
   providing a first wafer comprising:
     a plurality of alignment areas having a first surface charge of a first polarity, each alignment area of the plurality of alignment areas having four edges, a first diagonal between a first vertex and a second vertex, and a second diagonal between a third vertex and a fourth vertex, the first diagonal extending in a first direction, the second diagonal being shorter than the first diagonal; and
     a plurality of spacing areas having a second surface charge of a second polarity that is different than the first polarity, the four edges of each alignment area of the plurality of alignment areas abutting at least one spacing area of the plurality of spacing areas; and
   depositing a first carbon nanotube onto the first wafer such that the first carbon nanotube is positioned on a first alignment area of the plurality of alignment areas, the first carbon nanotube extending in the first direction along the first diagonal of the first alignment area.

8. The method of claim 7, further comprising depositing a second carbon nanotube onto the first wafer adjacent to the first carbon nanotube, the second carbon nanotube being positioned on a second alignment area of the plurality of alignment areas, the second carbon nanotube extending in the first direction along the first diagonal of the second alignment area, a distance between the first diagonal of the first alignment area and the first diagonal of the second alignment area being no more than about 10 nanometers.

9. The method of claim 7, further comprising depositing a plurality of carbon nanotubes on the first wafer such that each carbon nanotube of the plurality of carbon nanotubes is positioned on a respective alignment area of the plurality of alignment areas, each carbon nanotube extending in the first direction along a respective first diagonal of the respective alignment area.

10. The method of claim 7, further comprising:
    applying thermal release tape to a surface of the first wafer and the first carbon nanotube; and
    removing the thermal release tape and the first carbon nanotube from the first wafer.

11. The method of claim 10, further comprising:
    positioning the first carbon nanotube and the thermal release tape on a second wafer;
    releasing the first carbon nanotube from the thermal release tape; and
    removing the thermal release tape from the second wafer and the first carbon nanotube.

12. A method, comprising:
    forming a plurality of alignment areas and a plurality of spacing areas on a substrate, each alignment area of the plurality of alignment areas having edges, a first diagonal between a first vertex and a second vertex and extending along a first direction, and a second diagonal between a third vertex and a fourth vertex and extending along a second direction different from the first direction, the edges of each alignment area of the plurality of alignment areas abutting at least one spacing area of the plurality of spacing areas; and
    depositing a plurality of carbon nanotubes on the substrate, the plurality of carbon nanotubes being oriented by the plurality of alignment areas along the first direction such that each carbon nanotube of the plurality of carbon nanotubes overlies at least two alignment areas of the plurality of alignment areas.

13. The method of claim 12, wherein the plurality of alignment areas are arranged in rows and columns, the alignment areas in respective rows being linked to each other along the first direction via the first and second vertices, and the alignment areas in respective columns being linked to each other along the second direction via the third and fourth vertices.

14. The method of claim 12, wherein a dimension of each alignment area of the plurality of alignment areas is less than a length of each carbon nanotube of the plurality of Nano carbon tubes.

15. The method of claim 12, wherein the plurality of carbon nanotubes is separated from each other by the plurality of spacing areas.

16. The method of claim 12, wherein forming the plurality of alignment areas and the plurality of spacing areas comprises forming the plurality of alignment areas having a first surface charge of a first polarity and forming the plurality of spacing areas having a second surface charge of a second polarity that is different than the first polarity.

17. The method of claim 16, wherein the first surface charge is a positive charge, and the second surface charge is a negative charge.

18. The method of claim 12, wherein the second diagonal is shorter than the first diagonal.

19. The method of claim 12, wherein forming the plurality of alignment areas and the plurality of spacing areas comprises forming the plurality of alignment areas comprising a first material and the plurality of spacing areas comprising a second material different from the first material.

20. The method of claim 19, wherein the first material comprises a dielectric oxide, and the second materials comprises a metal oxide.

* * * * *